United States Patent
Lilak et al.

(10) Patent No.: US 11,869,894 B2
(45) Date of Patent: Jan. 9, 2024

(54) METALLIZATION STRUCTURES FOR STACKED DEVICE CONNECTIVITY AND THEIR METHODS OF FABRICATION

(71) Applicant: Intel Corporation, Santa Clara, CA (US)

(72) Inventors: Aaron D. Lilak, Beaverton, OR (US); Anh Phan, Beaverton, OR (US); Patrick Morrow, Portland, OR (US); Willy Rachmady, Beaverton, OR (US); Gilbert Dewey, Beaverton, OR (US); Jessica M. Torres, Portland, OR (US); Kimin Jun, Portland, OR (US); Tristan A. Tronic, Aloha, OR (US); Christopher J. Jezewski, Portland, OR (US); Hui Jae Yoo, Hillsboro, OR (US); Robert S. Chau, Beaverton, OR (US); Chi-Hwa Tsang, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/864,264

(22) Filed: Jul. 13, 2022

(65) Prior Publication Data
US 2022/0344376 A1    Oct. 27, 2022

Related U.S. Application Data

(63) Continuation of application No. 16/957,047, filed as application No. PCT/US2018/020945 on Mar. 5, 2018, now Pat. No. 11,430,814.

(51) Int. Cl.
*H01L 27/12* (2006.01)
*H01L 21/02* (2006.01)
(Continued)

(52) U.S. Cl.
CPC .... *H01L 27/1207* (2013.01); *H01L 21/02532* (2013.01); *H01L 21/28568* (2013.01);
(Continued)

(58) Field of Classification Search
CPC ................. H01L 29/0847; H01L 29/16; H01L 29/41797; H01L 29/45; H01L 29/66795;
(Continued)

(56) References Cited

U.S. PATENT DOCUMENTS 4,939,568 A    7/1990  Kato et al.
5,355,022 A    10/1994 Sugahara et al.
(Continued)

FOREIGN PATENT DOCUMENTS

CN    1309077 C    4/2007
CN    105448998    3/2016
(Continued)

OTHER PUBLICATIONS

Office Action from Taiwanese Patent Application No. 108102557 dated Aug. 30, 2022, 14 pgs.
(Continued)

*Primary Examiner* — Monica D Harrison
(74) *Attorney, Agent, or Firm* — Essential Patents Group, LLP

(57) ABSTRACT

A stacked device structure includes a first device structure including a first body that includes a semiconductor material, and a plurality of terminals coupled with the first body. The stacked device structure further includes an insulator between the first device structure and a second device structure. The second device structure includes a second body such as a fin structure directly above the insulator. The second device structure further includes a gate coupled to the fin structure, a spacer including a dielectric material adjacent to the gate, and an epitaxial structure adjacent to a (Continued)

sidewall of the fin structure and between the spacer and the insulator. A metallization structure is coupled to a sidewall surface of the epitaxial structure, and further coupled with one of the terminals of the first device.

20 Claims, 26 Drawing Sheets

(51) Int. Cl.
    *H01L 21/285*     (2006.01)
    *H01L 21/84*     (2006.01)
    *H01L 29/08*     (2006.01)
    *H01L 29/16*     (2006.01)
    *H01L 29/417*     (2006.01)
    *H01L 29/45*     (2006.01)
    *H01L 29/66*     (2006.01)
    *H01L 29/78*     (2006.01)
    *H10B 61/00*     (2023.01)
    *H10B 63/00*     (2023.01)

(52) U.S. Cl.
    CPC ........ *H01L 21/845* (2013.01); *H01L 27/1211* (2013.01); *H01L 29/0847* (2013.01); *H01L 29/16* (2013.01); *H01L 29/41791* (2013.01); *H01L 29/45* (2013.01); *H01L 29/66795* (2013.01); *H01L 29/785* (2013.01); *H10B 61/22* (2023.02); *H10B 63/30* (2023.02)

(58) Field of Classification Search
    CPC ............... H01L 29/785; H01L 27/1207; H01L 27/1211; H01L 21/02532; H01L 21/28568; H01L 21/845; H10B 61/22; H10B 63/30
    USPC ........................................................ 257/107
    See application file for complete search history.

(56) References Cited

U.S. PATENT DOCUMENTS

| | | | |
|---|---|---|---|
| 5,869,867 A | 2/1999 | Takeuchi | |
| 6,424,020 B1 | 7/2002 | Vu et al. | |
| 6,455,398 B1 | 9/2002 | Fonstad et al. | |
| 6,605,951 B1 | 8/2003 | Cowan | |
| 6,627,953 B1 | 9/2003 | Vu et al. | |
| 7,091,534 B2 | 8/2006 | Koyanagi | |
| 7,095,068 B2 | 8/2006 | Kumura et al. | |
| 7,402,866 B2 | 7/2008 | Liang et al. | |
| 7,479,673 B2 | 1/2009 | Jang et al. | |
| 7,825,472 B2 | 11/2010 | Park et al. | |
| 7,947,540 B2 | 5/2011 | Lee | |
| 8,018,008 B2 | 9/2011 | Ozoe | |
| 8,084,795 B2 | 12/2011 | Pan | |
| 8,354,675 B2 | 1/2013 | Kwon et al. | |
| 8,395,191 B2 | 3/2013 | Or-Bach et al. | |
| 8,426,888 B2 | 4/2013 | Molin | |
| 9,129,926 B2 | 9/2015 | Koo et al. | |
| 9,171,887 B2 | 10/2015 | Yokoyama | |
| 9,184,136 B2 | 11/2015 | Kim et al. | |
| 9,305,834 B1 | 4/2016 | Latypov et al. | |
| 9,385,195 B1 | 7/2016 | Zhang | |
| 9,412,788 B2 | 8/2016 | Yokoyama et al. | |
| 9,450,075 B2 | 9/2016 | Huang | |
| 9,627,476 B2 | 4/2017 | Diaz et al. | |
| 9,640,531 B1 | 5/2017 | Or-Bach et al. | |
| 9,786,783 B2 | 10/2017 | Hafez et al. | |
| 9,818,856 B2 | 11/2017 | Hoshi et al. | |
| 9,929,133 B2 | 3/2018 | Lin et al. | |
| 10,128,257 B2 * | 11/2018 | Pang ................. | H10B 41/10 |
| 10,420,171 B2 | 9/2019 | Goktepeli | |
| 10,790,281 B2 | 9/2020 | Mehandru et al. | |
| 10,872,820 B2 | 12/2020 | Block et al. | |
| 2001/0041407 A1 | 11/2001 | Brown | |
| 2002/0119640 A1 | 8/2002 | Gonzalez | |
| 2004/0119165 A1 | 6/2004 | Baukus et al. | |
| 2005/0151276 A1 | 7/2005 | Jang et al. | |
| 2005/0275017 A1 | 12/2005 | Pozder et al. | |
| 2006/0115943 A1 | 6/2006 | Koyanagi | |
| 2006/0246709 A1 | 11/2006 | Kim et al. | |
| 2007/0001219 A1 | 1/2007 | Radosavljevic et al. | |
| 2007/0001232 A1 | 1/2007 | King et al. | |
| 2007/0181880 A1 | 8/2007 | Kim | |
| 2007/0249130 A1 | 10/2007 | Anderson et al. | |
| 2007/0296002 A1 | 12/2007 | Liang et al. | |
| 2008/0061285 A1 | 3/2008 | Arghavani et al. | |
| 2008/0179678 A1 | 7/2008 | Dyer et al. | |
| 2008/0185648 A1 | 8/2008 | Jeong et al. | |
| 2008/0217665 A1 | 9/2008 | Chen et al. | |
| 2009/0114955 A1 | 5/2009 | Stapelmann et al. | |
| 2009/0152611 A1 | 6/2009 | Fujimoto | |
| 2009/0166677 A1 | 7/2009 | Shibata et al. | |
| 2011/0095289 A1 | 4/2011 | Sasaki et al. | |
| 2011/0193240 A1 | 8/2011 | Farooq et al. | |
| 2011/0241073 A1 | 10/2011 | Cohen et al. | |
| 2012/0043663 A1 | 2/2012 | Ko et al. | |
| 2012/0088339 A1 | 4/2012 | Molin et al. | |
| 2012/0205727 A1 | 8/2012 | Kanakasabapathy et al. | |
| 2013/0130479 A1 | 5/2013 | Stuber et al. | |
| 2013/0134585 A1 | 5/2013 | Stuber et al. | |
| 2013/0162346 A1 | 6/2013 | McElvain et al. | |
| 2013/0193583 A1 | 8/2013 | Yi et al. | |
| 2013/0241004 A1 | 9/2013 | Yin et al. | |
| 2014/0054685 A1 | 2/2014 | Consentino et al. | |
| 2014/0210058 A1 | 7/2014 | Lee et al. | |
| 2014/0231874 A1 | 8/2014 | Hoshi et al. | |
| 2014/0264485 A1 | 9/2014 | Li et al. | |
| 2014/0264632 A1 | 9/2014 | Richter et al. | |
| 2014/0332749 A1 | 11/2014 | Yokoyama | |
| 2015/0028289 A1 | 1/2015 | Hekmatshoartabari | |
| 2015/0054033 A1 | 2/2015 | Cheng et al. | |
| 2015/0061020 A1 | 3/2015 | Yokoyama et al. | |
| 2015/0061026 A1 | 3/2015 | Lin et al. | |
| 2015/0069520 A1 | 3/2015 | Lee | |
| 2015/0129891 A1 | 5/2015 | Lin et al. | |
| 2015/0137224 A1 | 5/2015 | Meiser et al. | |
| 2015/0137842 A1 | 5/2015 | Murakami et al. | |
| 2015/0206936 A1 | 7/2015 | Huang | |
| 2015/0235949 A1 | 8/2015 | Yu et al. | |
| 2015/0280010 A1 | 10/2015 | Shieh et al. | |
| 2015/0347659 A1 | 12/2015 | Chiang et al. | |
| 2015/0348909 A1 | 12/2015 | Yamazaki et al. | |
| 2015/0348945 A1 | 12/2015 | Or-Bach et al. | |
| 2015/0348997 A1 | 12/2015 | Sasagawa et al. | |
| 2015/0357425 A1 | 12/2015 | Liu et al. | |
| 2015/0380305 A1 | 12/2015 | Basker et al. | |
| 2016/0043083 A1 | 2/2016 | Kawa et al. | |
| 2016/0093629 A1 | 3/2016 | Wang | |
| 2016/0095221 A1 | 3/2016 | Ramachandran et al. | |
| 2016/0197069 A1 | 7/2016 | Morrow et al. | |
| 2016/0247887 A1 | 8/2016 | Jun et al. | |
| 2016/0307996 A1 | 10/2016 | Meiser et al. | |
| 2016/0351492 A1 | 12/2016 | Watanabe et al. | |
| 2017/0345829 A1 | 11/2017 | Balakrishnan et al. | |
| 2018/0197895 A1 | 7/2018 | Liu | |
| 2019/0057959 A1 | 2/2019 | Or-Bach et al. | |
| 2020/0035560 A1 | 1/2020 | Block et al. | |
| 2021/0384191 A1 | 12/2021 | Pillarisetty et al. | |

FOREIGN PATENT DOCUMENTS

| | | |
|---|---|---|
| EP | 1624487 | 2/2006 |
| EP | 1638142 | 3/2006 |
| JP | H05198739 | 8/1993 |
| JP | H09260669 | 3/1997 |
| JP | 2002538465 | 11/2002 |
| JP | 2004311703 | 11/2004 |
| JP | 2008529012 | 7/2008 |
| JP | 2009295961 | 12/2009 |
| JP | 2012195539 | 10/2012 |
| JP | 2013120887 | 6/2013 |
| JP | 2014220376 | 11/2014 |

(56) References Cited

FOREIGN PATENT DOCUMENTS

| | | |
|---|---|---|
| JP | 2014170940 | 3/2017 |
| KR | 100737920 | 7/2007 |
| KR | 100746220 | 8/2007 |
| KR | 20070081025 | 8/2007 |
| KR | 1020100106702 | 10/2010 |
| TW | 201642474 | 12/2016 |
| TW | 201729423 | 8/2017 |
| WO | 2013004836 | 1/2013 |
| WO | 2013166116 | 11/2013 |
| WO | 2017052562 | 3/2017 |
| WO | 2017052626 | 3/2017 |
| WO | 2017095409 | 6/2017 |
| WO | 2018031175 | 2/2018 |

OTHER PUBLICATIONS

International Search Report and Written Opinion from PCT/US2018/020945 dated Jan. 22, 2019, 22 pgs.
Notice of Allowance from U.S. Appl. No. 16/957,047 dated Apr. 27, 2022, 9 pgs.
Notice of Allowance from U.S. Appl. No. 16/957,047 dated Jan. 21, 2022, 10 pgs.
Kang, Chang Yong, et al., "Effects of Film Stress Modulation Using TiN Metal Gate on Stress Engineering and its Impacton Device Characteristics in Metal Gate/High-k Dielectric SOI FinFETs", IEEE Electron Device Letters, vol. 29, No. 5, May 2008, 4pgs.
Notice of Allowance from Taiwanese Patent Application No. 108102557 dated Apr. 27, 2023, 3 pgs.

* cited by examiner

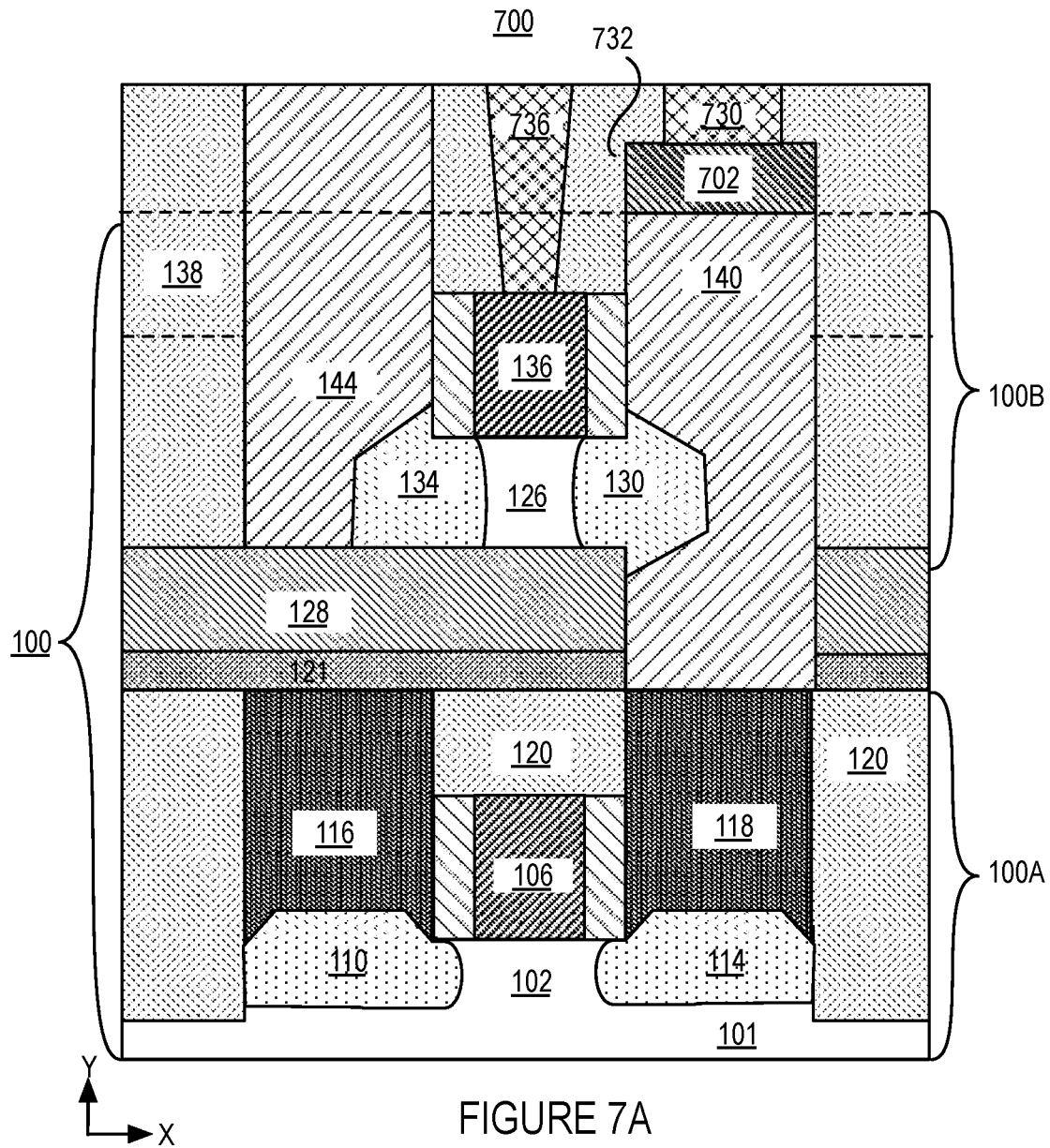
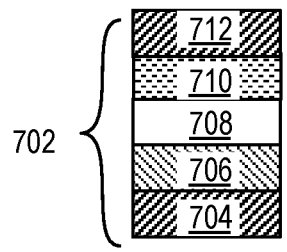
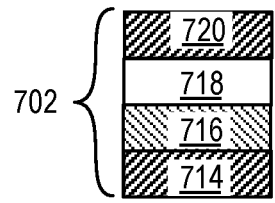
FIGURE 7A
FIG. 7B
FIG. 7C

METALLIZATION STRUCTURES FOR STACKED DEVICE CONNECTIVITY AND THEIR METHODS OF FABRICATION

CLAIM OF PRIORITY

This application is a continuation of, and claims the benefit of priority to, U.S. patent application Ser. No. 16/957,047, filed on Jun. 22, 2020 and titled "METALLIZATION STRUCTURES FOR STACKED DEVICE CONNECTIVITY AND THEIR METHODS OF FABRICATION," which is a National Stage Entry of, and claims the benefit of priority to, PCT Application No. PCT/US2018/020945, filed on Mar. 5, 2018 and titled "METALLIZATION STRUCTURES FOR STACKED DEVICE CONNECTIVITY AND THEIR METHODS OF FABRICATION," which is incorporated by reference in entirety.

BACKGROUND

Generally, transistors are an important basis of modern electronics. High performance transistors typically used for switching in modern computer devices may be stacked for processing efficiency through improved cache, for instance. However, scaling in transistor size and reduction in fin cross sectional area can lead to space limitations in forming metallization structures between one or more stacked transistors. There is an ongoing need to find alternative methods for connecting terminals of stacked transistor having reduced footprint. It is with respect to these and other considerations that the present improvements are needed. Such improvements may become critical as the desire for increasing transistor density becomes even more widespread in logic and embedded memory applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 7A illustrates a cross-sectional view of a memory cell including a device structure with a pair of stacked transistors, and a non-volatile memory device coupled to a metallization structure an upper transistor.

FIG. 7B illustrates a cross-sectional view of a non-volatile memory element that includes a magnetic tunnel junction (MTJ) material device.

FIG. 7C illustrates a cross-sectional view of a non-volatile memory element that includes a resistive random-access memory (RRAM) device.

DESCRIPTION OF THE EMBODIMENTS

Figure 1A:
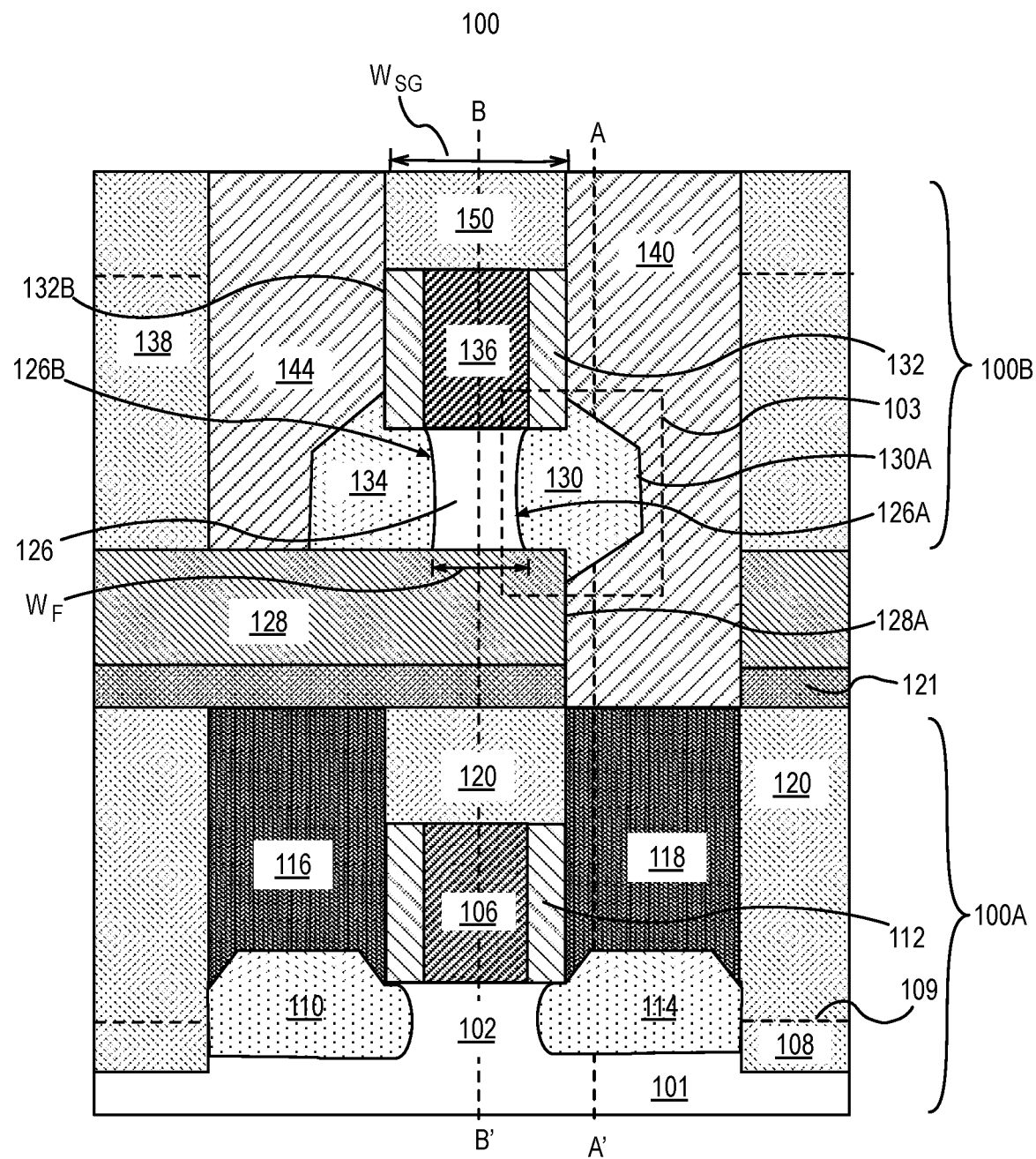
FIG. 1A illustrates a cross-sectional view of a stacked device structure in accordance with embodiments of the present disclosure.

Devices including metallization structures for stacked transistor connectivity for logic, SoC and embedded memory applications and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with the devices, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. As transistors are scaled, stacking of transistors provides a means for increasing transistor density. Increased transistor density may be utilized for improving processing efficiency, for example. However, scaling in transistor size involves scaling various components of the transistor such as a gate length, length of source and drain regions, length and height of epitaxial structures formed in the source and drain regions and width of metallization structures coupled with the epitaxial structures. Furthermore, scaling also reduces an effective distance between neighboring transistors. Stacking a large collection of scaled transistors on another large collection of scaled transistors may result in a high-density transistor array. A high-density transistor array can be useful in principle for improving processing efficiency, but challenges still remain in connecting physically separated upper and lower levels of transistors. While the upper level transistors can be connected relatively easily, routing connections to multiple metallization structures in each lower level transistor can occupy significant lateral real estate. One option is to connect an upper metallization structure coupled with an epitaxial structure of an upper level transistor with a metallization structure coupled to a source or a drain of a physically corresponding lower level transistor. An epitaxial structure can be implemented that can simultaneously induce strain in an upper level transistor and enable the upper metallization structure to couple with the metallization of a lower level transistor. When an upper transistor includes an epitaxial structure adjacent to a fin structure, such an epitaxial structure may include portions below a lowermost plane of the fin structure. Furthermore, the geometry of the epitaxial structure and the upper metallization structure may reduce an effective contact resistance in the upper transistor.

In accordance with some embodiments, a stacked device structure includes a first device structure including a first body that includes a semiconductor material, and a plurality of terminals coupled with the first body. In one example the first device is a transistor. The stacked device structure further includes an insulator between the first device structure and a second device structure, where the second device structure includes a second body including a semiconductor material. The second body may be fin structure directly above the insulator. The second device structure further includes a gate coupled to the fin structure, a spacer including a dielectric material adjacent to the gate, an epitaxial structure adjacent to a sidewall of the fin structure and between the spacer and the insulator, where the epitaxial structure includes a semiconductor material different from the semiconductor material of the fin structure, and an impurity dopant. A metallization structure is coupled to sidewall surfaces of the epitaxial structure, and further coupled with one of the terminals of the first device. For optimizing strain in the second transistor the epitaxial structure may include portions that extend under the gate, portions that extend laterally beyond a sidewall surface of the spacer and a sidewall surface of the insulator layer, and portions below a lowermost plane of the fin structure.

FIG. 1A illustrates a cross-sectional view of a device structure 100. Device structure 100 includes a first device structure 100A and a second device structure 100B stacked above the first device structure 100A. As illustrated, the first device structure 100A is a transistor 100A having a fin structure 102, a gate 106 on the fin structure 102, and a source 110 and a drain 114 on the fin structure 102, where the gate 106 is between the source 110 and the drain 114. The device structure 100A further includes a first terminal 116 coupled to the source 110 and a second terminal 118 coupled to the drain 118. The device structure 100 further includes an insulator 128 between the transistor 100A and the second device structure 100B. In the illustrative embodiment, the second device structure 100B is a transistor 100B. The transistor 100B includes a fin structure 126 including a semiconductor material, a gate 136 coupled to the fin structure 126, a dielectric spacer 132 including a dielectric material adjacent to the gate 136, and an epitaxial structure 130 adjacent to a fin structure sidewall 126A, between the dielectric spacer 132 and the insulator 128. The presence of the epitaxial structure 130 advantageously provides strain in the fin structure 126. The second device structure 100B further includes a metallization structure 140 coupled to an epitaxial structure 130 and coupled with the terminal 118 of the transistor 100A.

Figure 1B:
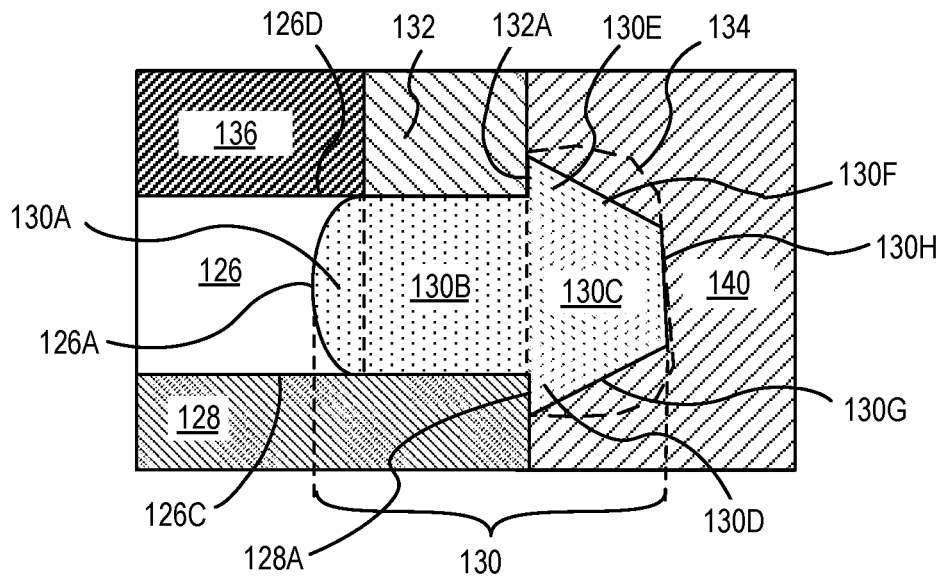
FIG. 1B illustrates a cross-sectional view of an epitaxial structure having a first portion between an insulator and a gate of the second transistor, a second portion between the insulator and a dielectric spacer, and a third portion extending beyond the dielectric spacer and the insulator, in accordance with embodiments of the present disclosure.
Figure 1B:
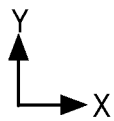

FIG. 1B illustrates an enhanced cross-sectional representation of a region depicted inside box 103 in FIG. 1A. In the illustrative embodiment, the fin structure sidewall 126A has a concaved surface as shown. In one such embodiment, the epitaxial structure 130 has an epitaxial structure portion 130A adjacent to fin structure sidewall 126A and between the insulator layer 128 and the gate 136. The epitaxial structure 130, as shown, further incudes, an epitaxial structure portion 130B between the insulator layer 128 and the dielectric spacer 136, and an epitaxial structure portion 130C extending beyond the dielectric spacer 132 and the insulator layer 128. The epitaxial structure portion 130C has a sidewall 130H that may extend 10 nm-30 nm laterally away from an insulator layer sidewall 128A. In some embodiments, the epitaxial structure portion 130C has a portion 130D that is laterally adjacent to the insulator layer sidewall 128A and a portion 130E on a dielectric spacer sidewall 132A. Portion 130D may also extend below a lowermost fin structure surface 126C, as is shown.

In some embodiments, epitaxial structure 130 has surfaces 130F and 130G that may be faceted with respect to the sidewall 130H as is shown in FIG. 1B. In the illustrative embodiment, the faceted surface 130G intersects the insulator layer sidewall 128A below the lowermost fin structure surface 126C and the faceted surface 130F intersect the dielectric spacer sidewall 132A above an uppermost fin structure surface 126D. In another embodiment, faceted surfaces 130F and 130G are not symmetrical about a horizontal axis (X-axis) of the epitaxial structure 130. In other embodiments, the epitaxial structure portion 130C has surfaces that are irregular as indicated by the dashed line 134. An irregular shaped epitaxial structure portion 130C may advantageously provide a larger volume than a regular shaped structure and possibly impart greater strain to the fin structure 126, than a symmetrically formed epitaxial structure portion 130C.

The fin structure 126 may include, for example, a suitable semiconductor material such as but not limited to, single crystal silicon, polycrystalline silicon or other semiconductor materials such as germanium or SiGe. The epitaxial structure 130 may include a compound including at least two group IV materials such as silicon and germanium and a dopant. In one example epitaxial structure 130 includes a compound such as $Si_XGe_{1-}x$, where X represents atomic percent. Depending on embodiments, epitaxial structure portions 130A, 130B and 130C can each include $Si_XGe_{1-}x$, having a different value of X. In other embodiments, X can vary within epitaxial structure portion 130A, within epitaxial structure portion 130B and/or within epitaxial structure portion 130C. Depending on a particular application, the germanium content in $Si_XGe_{1-}x$, can be graded continuously or vary by discrete amounts laterally across the epitaxial structure 130 (e.g., in x-dimension).

In some embodiments, epitaxial structure portion 130A includes a first portion of $Si_XGe_{1-}x$, having an X value that is substantially equal to 0.99 adjacent to the fin structure sidewall 126A, and a second portion where X varies between 0.99 to 0.70 across a lateral extent of the epitaxial structure portion 130A. In some such embodiments, the epitaxial structure portion 130B includes a $Si_XGe_{1-}x$, where X varies between 0.70 and 0.30 across a lateral extent of the epitaxial structure portion 130B. In some such embodiments, the epitaxial structure portion 130C includes a $Si_XGe_{1-}x$, where X is approximately 0.3.

In some embodiments, epitaxial structure 130A includes a first portion of $Si_XGe_{1-}x$, having an X value that is substantially equal to 0.99 adjacent to the fin structure sidewall 126A, and a second portion where X varies between 0.99 to 0.70 across a lateral extent of the epitaxial structure portion 130A. In some such embodiments, the epitaxial structure portion 130B includes a first portion of $Si_XGe_{1-}x$, where X is approximately 0.70 and a second portion where X is between 0.7 and 0.3. In some such embodiments, the epitaxial structure portion 130C includes a $Si_XGe_{1-}x$, that is matched with the X value of the second portion of the $Si_XGe_{1-}x$, epitaxial structure portion 130B.

In an embodiment, depending on the conductivity type of a metal-oxide-semiconductor transistor, the dopant includes phosphorus, boron or arsenic. In one example, the dopant density ranges between 1e21 atoms/cm$^3$ and 2e21 atoms/cm$^3$. Depending on structural embodiments, the dopant concentration may vary between the different epitaxial structure portions 130A, 130B and 130C. In some embodiments, epitaxial structure portion 130A has a first dopant concentration, and the epitaxial structure portion 130B has a second dopant concentration, where the first dopant concentration is less than the second dopant concentration. In some examples, epitaxial structure portion 130C has a dopant concentration that is substantially the same as the second dopant concentration of the epitaxial structure portion 130B. In some such embodiments the first dopant concentration is between approximately 1.0e21 atoms/cm$^3$ and 1.5 e21 atoms/cm$^3$ and the second dopant concentration is in the range of approximately 1.5-2 e21 atoms/cm$^3$. A dopant concentration of approximately 2e21 atoms/cm$^3$ in epitaxial structure portion 130C may reduce contact resistance between the epitaxial structure 130 and the metallization structure 140. In other embodiments, the dopant concentration gradually varies between 1.00e21 atoms/cm$^3$ and 2.0 e21 atoms/cm$^3$ laterally across the epitaxial structure 130. In some such embodiments, dopant concentration can vary within epitaxial structure portion 130A, within epitaxial structure portion 130B and within epitaxial structure portion 130C.

Figure 1C:
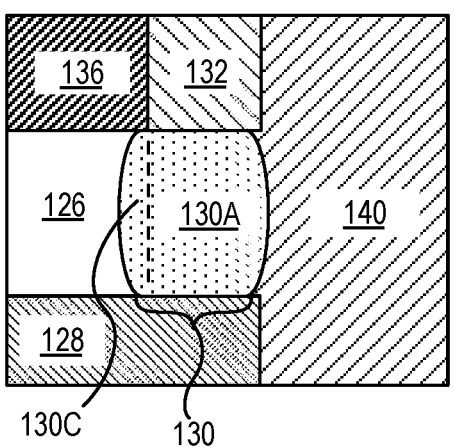
FIG. 1C illustrates a cross-sectional view of an epitaxial structure having a first portion between an insulator and a gate of the second transistor, a second portion between the insulator and a dielectric spacer, in accordance with embodiments of the present disclosure.

While an exemplary embodiment of the epitaxial structure 130 is as shown in FIG. 1B, in other embodiments, the epitaxial structure 130 does not extend beyond the dielectric spacer 132 and the insulator layer 128 as is depicted in FIG. 1C. In some such embodiments, the epitaxial structure 130 includes the epitaxial structure portion 130A between the insulator layer 128 and the gate 136, and the epitaxial structure portion 130B between the insulator layer 128 and the dielectric spacer 136.

Figure 1D:
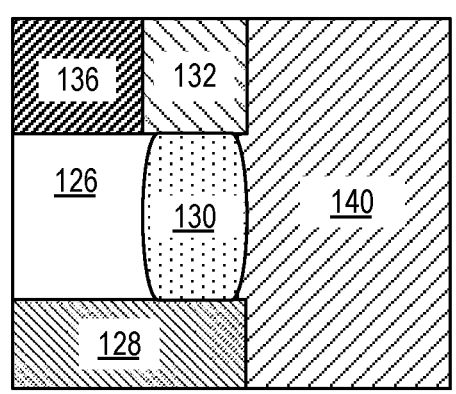
FIG. 1D illustrates a cross-sectional view of an epitaxial structure between a spacer and an insulator of the second transistor, in accordance with embodiments of the present disclosure.

In further embodiments, the fin structure 126 extends under the dielectric spacer 132, and the epitaxial structure 130 is between the dielectric spacer 132 and the insulator layer 128, as is depicted in FIG. 1D. In other examples, the epitaxial structure 130 may laterally extend beyond the dielectric spacer 132 and the insulator layer 128 (not shown).

Regardless of whether the epitaxial structure 130 has a structure depicted in FIG. 1B, 1C or 1D, the fin structure 126 has a width, $W_F$, that is less than a combined width, $W_{SG}$, of the gate 136 and the dielectric spacer 132 as is illustrated in FIG. 1A.

In other embodiments, the fin structure 126 includes GaAs, InAs, a ternary alloy comprising InP, or a ternary alloy comprising a group III-N, or a quaternary alloy comprising GaAs, a quaternary alloy comprising InAs, a quaternary alloy comprising InP, or a quaternary alloy comprising a group III-N. The epitaxial structure 130 may include a compound including one or more elements from group III, group IV, and group V and an n-type impurity (N$^+$ dopant). Referring again to FIG. 1A, in an embodiment, the device structure 100B further includes an epitaxial source structure 134 adjacent to a second fin structure sidewall 126B. In the illustrative embodiment, the epitaxial structure 134 has a portion between the gate 136 and the insulator layer 128, a portion between the dielectric spacer 132 and the insulator layer 128 and an epitaxial structure portion 134A that extends beyond the dielectric spacer 132. In some such embodiments, the epitaxial structure portion 134C has an asymmetrical shape about a horizontal axis of the epitaxial structure portion 134C. As illustrated, an upper portion of the epitaxial structure portion 134C is partially adjacent to a sidewall of the dielectric spacer 132 and the lower most surface of the epitaxial structure portion 134C is on the insulator 128. Depending on embodiments, the epitaxial source structure 134 may also include structures such as the structures of the epitaxial structure 130 described in FIGS. 1C and 1D. In some such embodiments, the epitaxial structure 134 does not have portions that laterally extend away from spacer sidewall 132A. The epitaxial structure 134 includes materials that are the same or substantially the same as the epitaxial structure 130 described above.

Figure 1E:
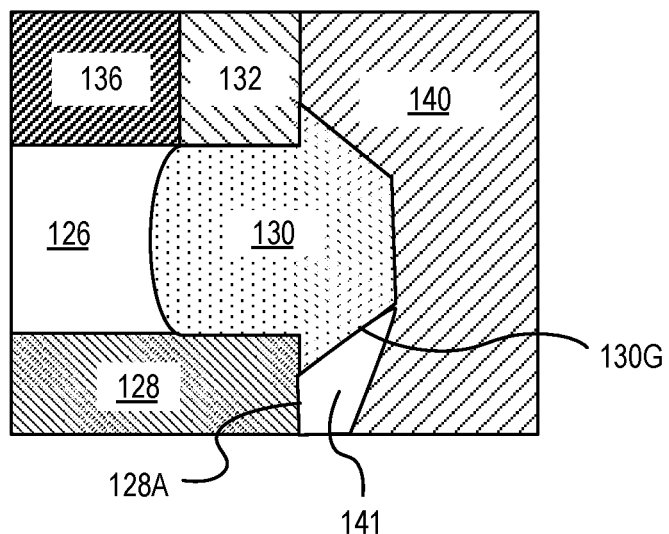
FIG. 1E illustrates a cross-sectional view of an epitaxial structure extending beyond the dielectric spacer and the insulator and a void between the sidewall of the insulator layer below the epitaxial structure and a metallization structure, in accordance with embodiments of the present disclosure.

In an embodiment, the device structure 100 further includes a metallization structure 144 that is coupled to the epitaxial structure 134 as shown in FIG. 1A. In some embodiments, as shown in FIG. 1A, the metallization structure 144 is not coupled with the terminal 116 of the transistor 100A. In the illustrative embodiment, the metallization structure 140 is on the insulator layer sidewall 128A below the epitaxial structure 130. In some embodiments, the metallization structure 140 includes at least one of a metal such as, but not limited to, titanium, tungsten, cobalt, ruthenium, and titanium or at least one of a compound comprising titanium, a compound comprising tantalum, a compound comprising a group III material or a compound of tungsten. Depending on shape and lateral extent of the epitaxial structures 140 or 144, the metallization structure may or may not be conformal with surfaces of the epitaxial structures 130 or 134, respectively. In some examples, there may be a void 141 between the insulator layer sidewall 128A and the metallization structure 140, below the faceted fin structure sidewall 130G, as is depicted in the cross-sectional illustration of FIG. 1E.

Figure 1F:
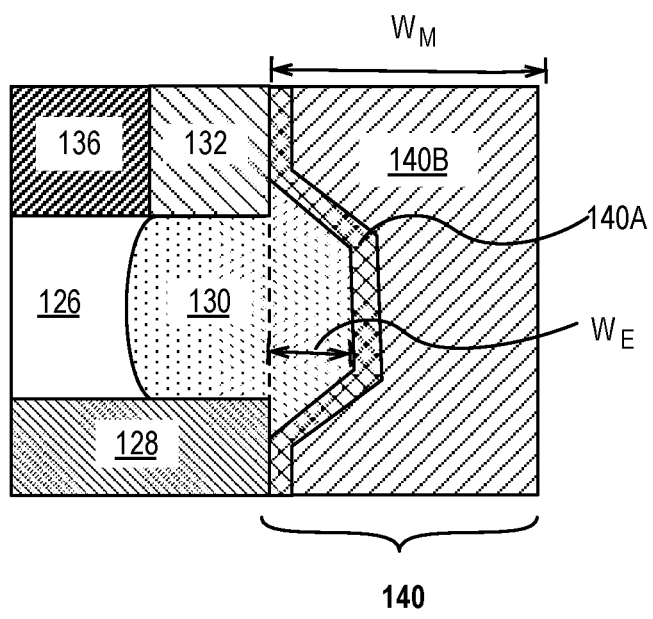
FIG. 1F illustrates a cross-sectional view of a metallization structure including an adhesion layer adjacent to the epitaxial structure, in accordance with embodiments of the present disclosure.

In some embodiments, when the metallization structure has a width WM, that is between 2-5 times a width, $W_E$, of the epitaxial structure portion 130C, the metallization structure 140 includes an adhesion layer 140A in contact with the epitaxial structure 130 and a fill layer 140B adjacent to the adhesion layer 140A, as shown in the cross-sectional illustration of FIG. 1F. The adhesion layer 140A may include a material such as titanium nitride, titanium, ruthenium or cobalt, and has a thickness between 2 nm-5 nm.

Figure 1G:
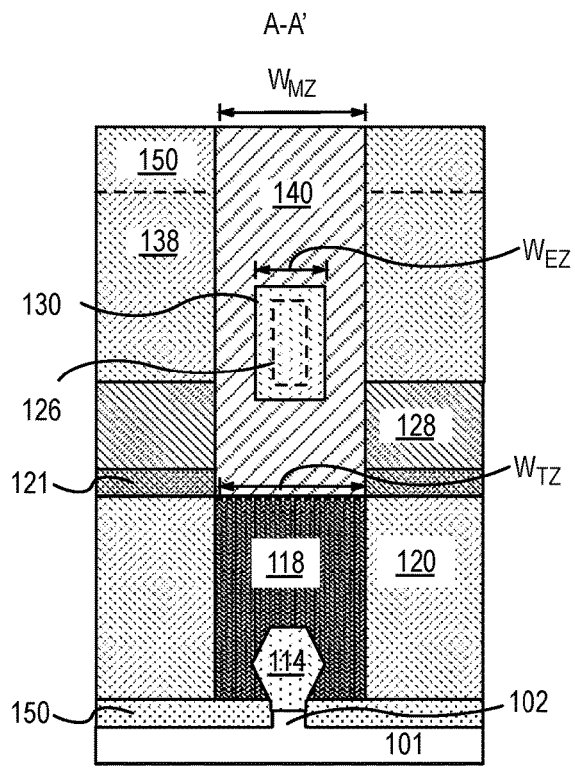
FIG. 1G illustrates a cross-sectional view depicting a cross sectional view through a vertical plane of the stacked device structure in FIG. 1A, in accordance with embodiments of the present disclosure.

FIG. 1G illustrates a cross sectional illustration through the line A-A' in FIG. 1A, and depicts coverage of the metallization structure 140 around the source structure 130. In the illustrative embodiment, the epitaxial structure 130 has a rectangular cross-sectional profile and the metallization structure 140 is adjacent to four sides of the rectangular epitaxial structure 130. When the epitaxial structure 130 has surfaces that are irregular, the cross-sectional profile may be irregular. A dashed line inside the epitaxial structure 130 outlines the fin structure 126 relative to the epitaxial structure 130. In the illustrative embodiment, the metallization structure 140 has a width $W_{MZ}$, along the Z-axis that is greater than a width, $W_{EZ}$, of the epitaxial structure 130 along the Z-axis. In an exemplary embodiment, $W_{MZ}$ may be at least 2 times greater than $W_{TZ}$. $W_{EZ}$ In some embodiments, width $W_{MZ}$, of metallization structure 140 is substantially similar to a width $W_{TZ}$ of the terminal contact 118. In other examples $W_{MZ}$, may be less than $W_{TZ}$.

Figure 1H:
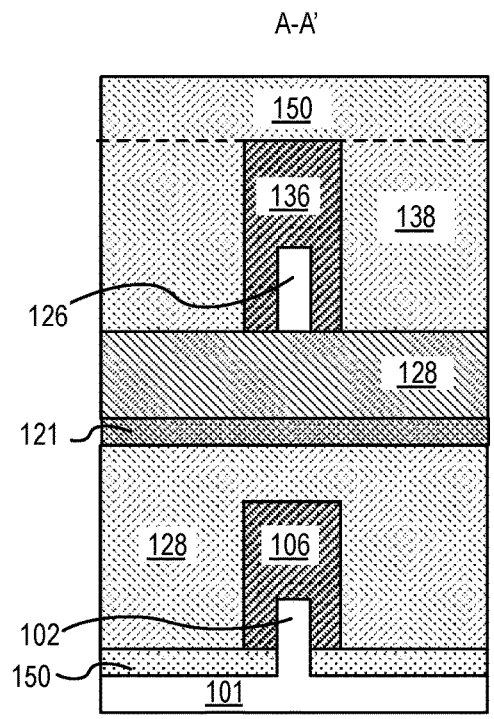
FIG. 1H illustrates a cross-sectional view depicting a first gate stacked above a second gate, in accordance with embodiments of the present disclosure.
Figure 1I:
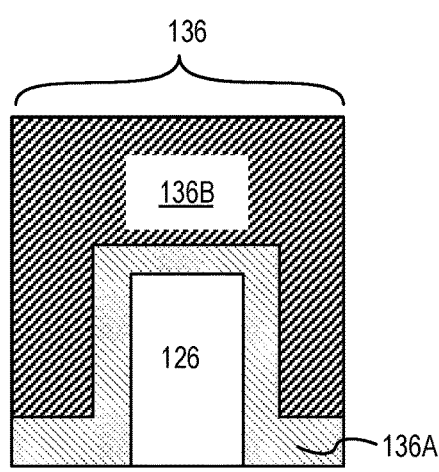
FIG. 1I illustrates a cross-sectional view of a gate electrode on a gate dielectric layer and a fin structure under the gate dielectric layer of a second transistor in FIG. 1A, in accordance with embodiments of the present disclosure.

FIG. 1H illustrates a cross sectional illustration through the line B-B' in FIG. 1A, and depicts the structures of gate 136 and gate 106. In the illustrative embodiment, gate 136 and gate 106 are vertically aligned. In embodiments, gate 136 is adjacent to three sides of the fin structure 126 and has lowermost surfaces that are on the insulator layer 128. In the exemplary embodiment, gate 106 is adjacent to three sides of the fin structure 102 and has lowermost surfaces that are on the dielectric layer 150.

The gate 136 may further include a gate dielectric layer 136A on the fin structure 102 and a gate electrode 136B on the gate dielectric layer 136A as is depicted in the cross-sectional illustration of Figure H. The gate dielectric layer 136A may include one or more layers. The one or more layers may include silicon dioxide ($SiO_2$) and/or a high-k dielectric material. The high-k dielectric material may include elements such as hafnium, silicon, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, gate electrode 136B has a work function in the range of 3.8 eV-4.5 eV. Similar to traditional MOSFETs, the work function of gate electrode 136B may be tuned to optimize threshold voltage. Depending on whether transistor 100B includes an N-channel MOSFET or a P-channel MOSFET, gate electrode 136B may include a P-type work function metal or an N-type work function metal to provide a PMOS or an NMOS transistor 100B.

For a PMOS transistor 100B, metals that may be used for gate electrode 136B include, but are not limited to, ruthenium, palladium, platinum, cobalt, nickel, and conductive metal oxides, e.g., ruthenium oxide. A P-type metal layer may enable the formation of a PMOS gate electrode with a work function between about 4.9 eV and about 5.2 eV. For an NMOS transistor 100B, metals that may be used for gate electrode 136B include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode 136B with a work function that is between about 3.9 eV and about 4.2 eV.

Figure 1J:
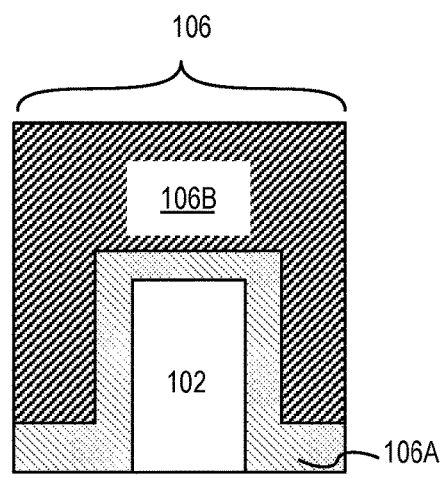
FIG. 1J illustrates a cross-sectional view of a gate electrode on a gate dielectric layer and a fin structure under the gate dielectric layer of a first transistor in FIG. 1A, in accordance with embodiments of the present disclosure.

The gate 106 may further include a gate dielectric layer 106A on the fin structure 102 and a gate electrode 106B on the gate dielectric layer 106A as is depicted in the cross-sectional illustration of FIG. 1J. Depending on embodiments, the gate dielectric layer 106A may be the same or substantially the same as the gate dielectric layer 136A. In some embodiments, the gate electrode 106B includes an NMOS or a PMOS work function metal. NMOS or PMOS work function metals may include metals described above. Referring once again to FIG. 1A, the insulator layer 128 may include any material that has sufficient dielectric strength to provide adequate electrical isolation. Insulator layer 128, may for example, be one or more dielectric materials known to be suitable for shallow trench isolation (STI) applications. Exemplary dielectric materials include silicon dioxide, silicon nitride, silicon oxynitride, carbon doped nitride and carbon doped oxide. The dielectric spacer 132 may include a material such as but not limited to silicon nitride, carbon doped silicon nitride, silicon oxynitride, or silicon carbide. The etch stop layer 121 may include any material that has sufficient dielectric strength to provide adequate electrical isolation. Etch stop layer 121, may for example, be one or more dielectric materials known to be suitable for shallow trench isolation (STI) applications. Exemplary dielectric materials include silicon nitride, silicon oxynitride, and carbon doped nitride. Dielectric layers 138 and 150 adjacent to metallization structures 140 and 144 may include may include any material that has sufficient dielectric strength to provide adequate electrical isolation.

Dielectric layers 138 and 150, may for example, be one or more dielectric materials known to be suitable for shallow trench isolation (STI) applications. Exemplary dielectric materials include silicon dioxide, and carbon doped oxide. In an embodiment, substrate 101 includes a suitable semiconductor material such as but not limited to, single crystal silicon, polycrystalline silicon or similar substrates 106 formed of other semiconductor materials such as germanium, silicon germanium or a suitable group III-V compound.

As shown, a dielectric spacer 112 is adjacent to the gate 106 and on a portion of an uppermost surface of the fin structure 102. Dielectric spacer 112 may include a material that is substantially the same as the material of the dielectric spacer 132.

In the illustrative embodiment, an isolation 108 is on the substrate 101. In an exemplary embodiment, an interface 109 between a dielectric layer 120 and the isolation layer 108 defines a lowermost plane for the gate 106. In one such embodiment, transistor 100A includes a non-planar transistor. Isolation 108 may include any material that has sufficient dielectric strength to provide adequate electrical isolation. Isolation 108, may for example, be one or more dielectric materials known to be suitable for shallow trench isolation (STI) applications. Exemplary dielectric materials include silicon dioxide, silicon nitride, silicon oxynitride, carbon doped nitride and carbon doped oxide.

In some embodiments, source structure 116 and drain structure 118 include a silicon alloy such as silicon germanium or silicon carbide. In an embodiment, the silicon alloy may include dopants such as boron, arsenic, or phosphorous. In further embodiments, the source structure 114 and drain structure 118 include one or more alternate semiconductor materials such as doped-germanium or a group III-V material or alloy.

Figure 1K:
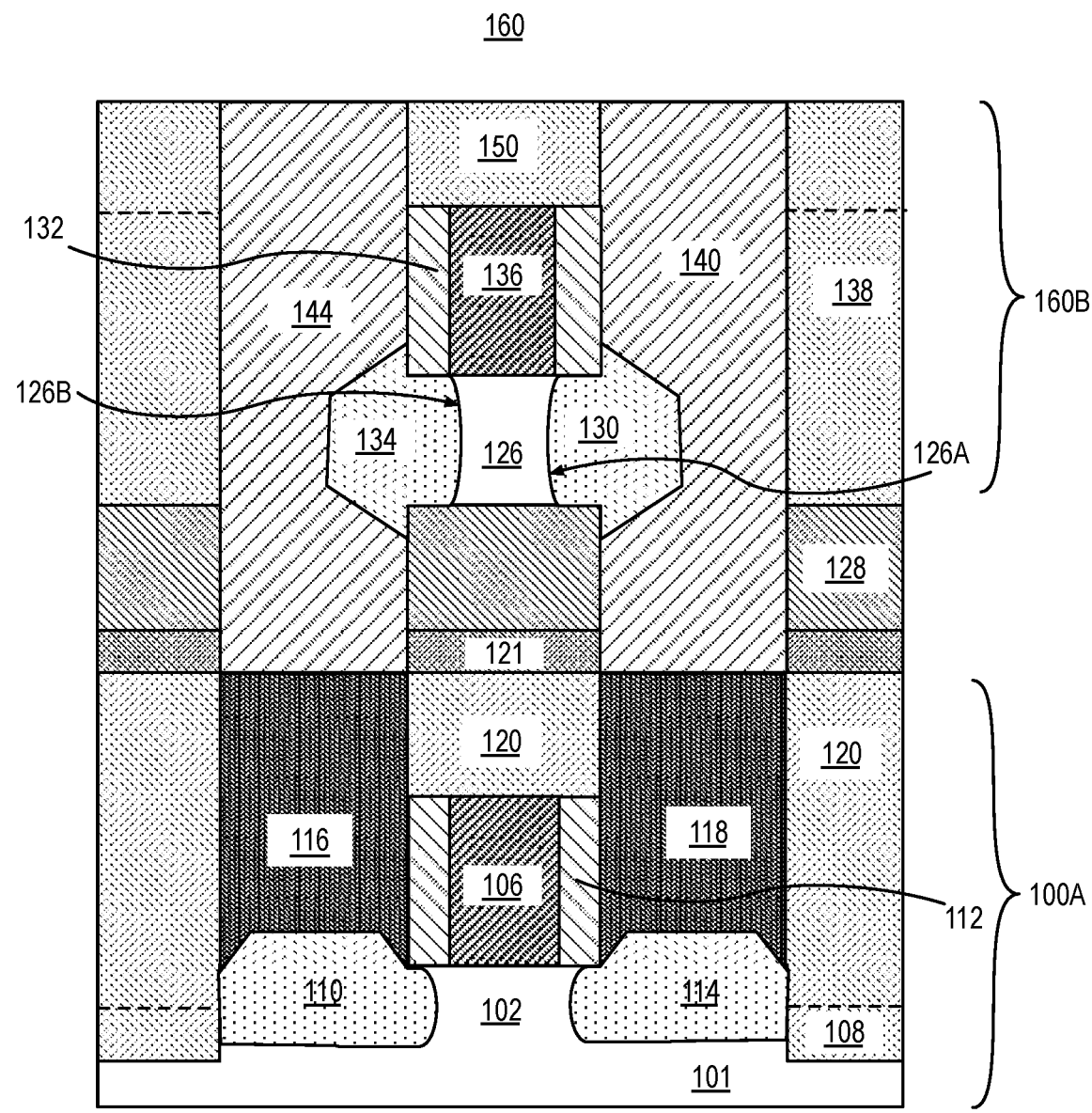
FIG. 1K illustrates a cross-sectional view of a stacked device structure where terminals of a first transistor are coupled with metallization structures of a second transistor, in accordance with embodiments of the present disclosure.

While the metallization structure 144 illustrated in FIG. 1A is not coupled to the terminal 116 of the transistor 100A, in other structural embodiments, the metallization structure 144 may be coupled with the transistor 100A. FIG. 1K illustrates a cross-sectional illustration of a device structure 160 including a transistor 160B, where the metallization structure 144 is coupled with the epitaxial structure 134 and the first terminal 114 of the device structure 100A. In the illustrative embodiment, the epitaxial structure 134 has one or more features that are substantially similar to the one or more features of the epitaxial structure 130 described in FIG. 1A. Depending on embodiments, epitaxial structure 134 has one or more features that are substantially similar to the one or more features of the epitaxial structure 130 described in FIGS. 1B-1D. Depending on embodiments, metallization structure 144 has one or more features that are substantially similar to the one or more features of the metallization structure 140 described in FIGS. 1E-1F.

Figure 2:
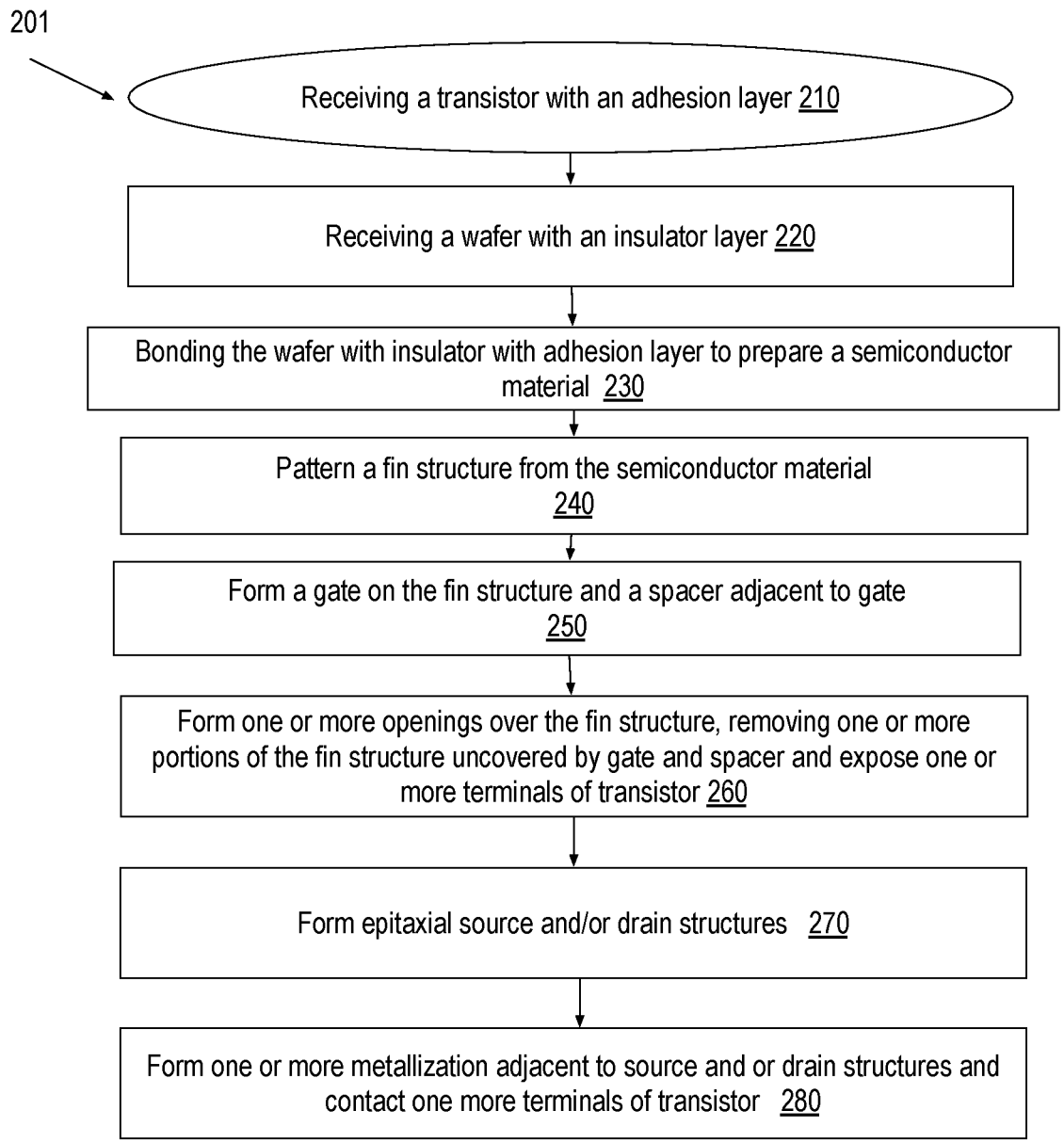
FIG. 2 is a flow diagram illustrating methods of forming the device structure depicted in FIG. 1A or 1K.

FIG. 2 illustrates a method 201 for fabricating a stacked device structure in accordance with embodiments of the present disclosure. Method 201 begins with receiving a wafer including an insulator on a first device structure, the first device structure having a plurality of terminals. In a subsequent operation 220, a second wafer with insulator on a semiconductor substrate is received. The method 201 is continued in operation 230 with bonding the two wafers in a manner that forms an interface between the first insulator and the second insulator and portions of the substrate of the second wafer is polished and removed to thin the semiconductor substrate. The semiconductor substrate is patterned to form a semiconductor body during operation 240. A gate is formed on a portion of the semiconductor body and a spacer is formed adjacent to the gate and a dielectric layer over the gate and the spacer and on portions of the semiconductor body in operation 250. Method 201 is continued with operation 260 to form one or more openings in the dielectric layer to remove portions of the semiconductor body uncovered by the spacer and the gate. The one or more openings also etch portions of the insulator layer directly below the semiconductor body and expose one or more of the plurality of terminals of the first device. In a subsequent operation 270, one or more sidewalls formed during the etching of the semiconductor body are laterally recessed under the spacer. An epitaxial structure is formed adjacent to each of the one or more laterally recessed sidewalls in the one or more opening in operation 280. The method concludes in operation 290 by forming a metallization in each of the one or more openings adjacent to the one or more epitaxial structures and coupling with one or more of the plurality of terminals of the first device. In an instance where a single opening is formed in method 201 outlined above, operations 240-290 are repeated after forming a second opening to etch a second portion of the semiconductor body but the opening does not expose a second of the plurality of terminals of the first device. Other elements of the operation 240-290 remain substantially similar.

Figure 3:
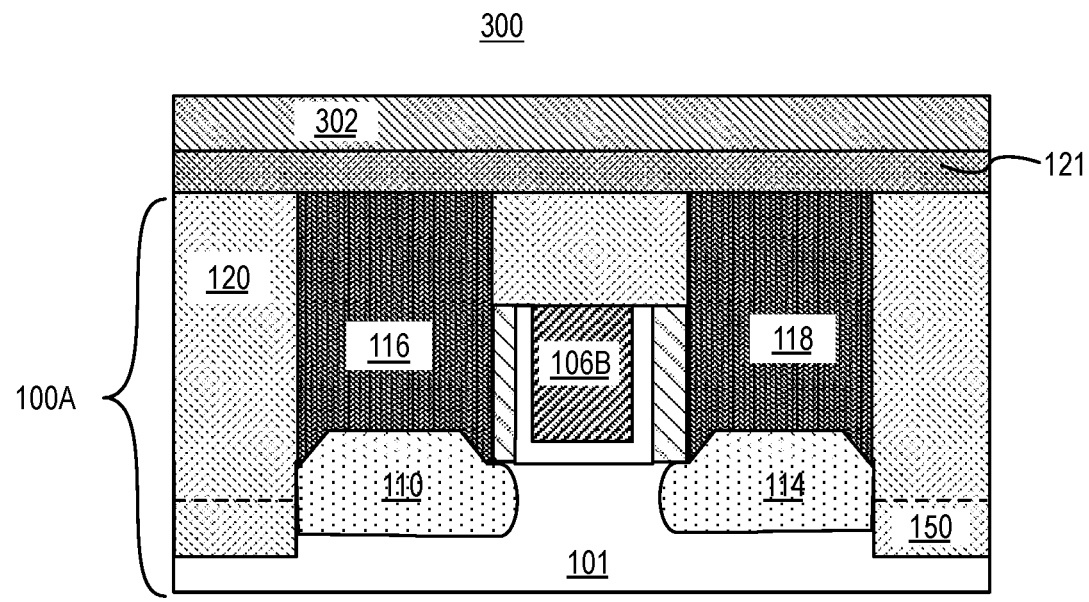
FIG. 3 illustrates a cross sectional view of an etch stop layer on a first device structure and an insulator layer on the etch stop layer, in accordance with embodiments of the present disclosure.
Figure 4:
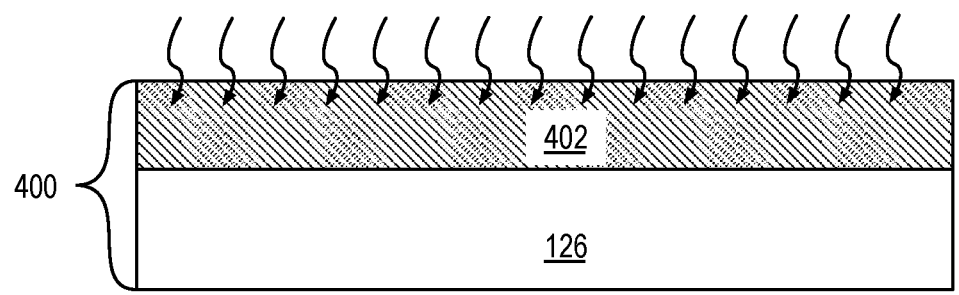
FIG. 4 illustrates a cross sectional view of a wafer including an insulator layer formed on a semiconductor substrate.

FIG. 3 illustrates a cross sectional view of a first device structure 300 including an etch stop layer 121 on the first device structure 300 and an insulator layer 302 on the etch stop. In an exemplary embodiment, the device structure 300 includes a transistor such as transistor 100A having a terminal 114, terminal 118 and a gate 106 therebetween, as described in association with FIG. 1A. The Insulator layer 302 may include any material that has sufficient dielectric strength to provide adequate electrical isolation. Insulator layer 302, may for example, be one or more dielectric materials known to be suitable for wafer bonding applications and deposited by plasma enhanced chemical vapor deposition (PECVD) or chemical vapor deposition (CVD). The thickness of the second insulator layer may range from 50 nm-150 nm. The etch stop layer 121, may for example, be one or more dielectric materials known to be suitable for acting as an etch stop during patterning of trenches in dielectric layers that require etch selectivity. The etch stop layer 121 may include a dielectric layer such as silicon nitride, silicon carbide or a carbon doped silicon nitride. The thickness of the etch stop layer 121 may range from 10 nm-50 nm. FIG. 4 illustrates a cross sectional view of a wafer 400 including an insulator layer 402 formed on a semiconductor substrate 126. The insulator layer 402 may include a thermal oxide grown on the wafer by a plasma enhanced chemical vapor deposition process (PECVD), chemical vapor deposition process (CVD), or by thermal oxidation of the semiconductor substrate 126. The thickness of the second insulator layer may range from 80 nm-150 nm. After formation of the insulator layer 402, the wafer 400 may be subjected to ion implantation through the insulator layer 402. The species, dose, and time duration of the ion implantation is governed by the desired thickness of a resulting substrate to be formed after the completion of a bonding process.

Figure 5A:
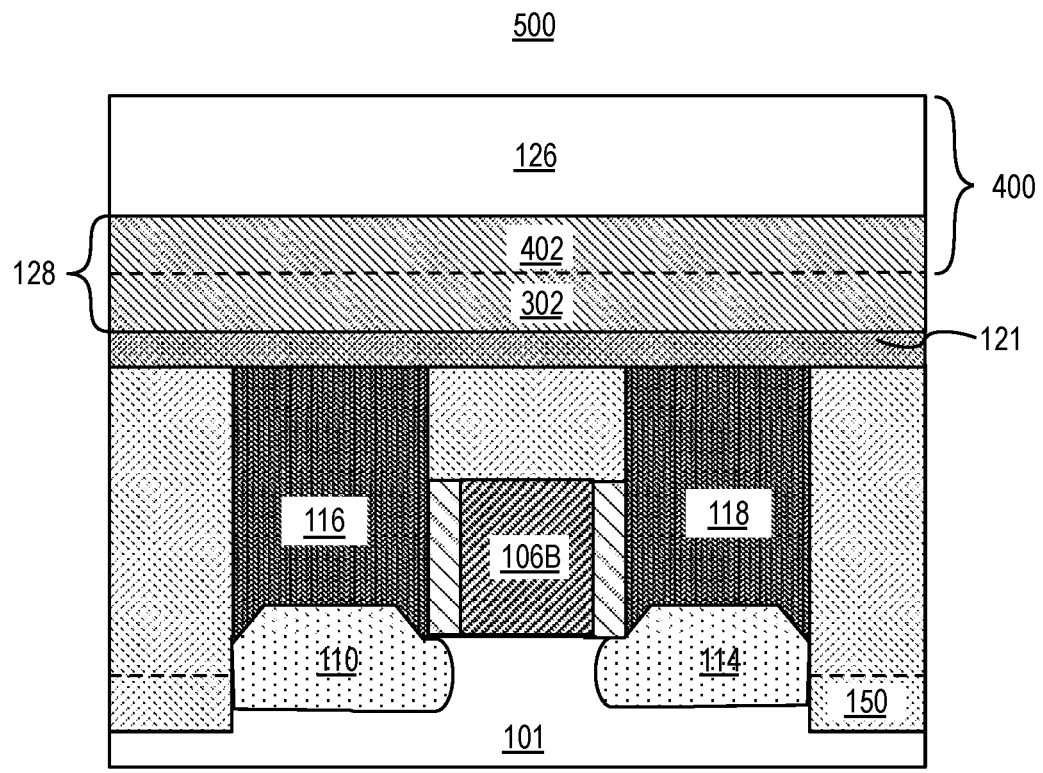
FIG. 5A illustrates a cross sectional view of the wafer bonded onto the insulator layer of the first device structure, so as to form a bonded substrate.

FIG. 5A illustrates a cross sectional view of the wafer 400 bonded onto the first insulator layer 300 of the device structure 300, so as to form a bonded substrate 500. In an embodiment, the bonded substrate 500 includes a newly formed insulator layer 128 including insulator layers 402 and 302. In some embodiments, the interface between the insulator layers 302 and 402 may be distinguishable while in others the interface may not be distinguishable. In one example semiconductor substrate 126 may be subsequently planarized to a desired thickness suitable for forming an active channel, a source and a drain region for a transistor. Depending on embodiments, the semiconductor substrate 126 may have a thickness ranging between 30 nm-100 nm after the planarization process.

Figure 5B:
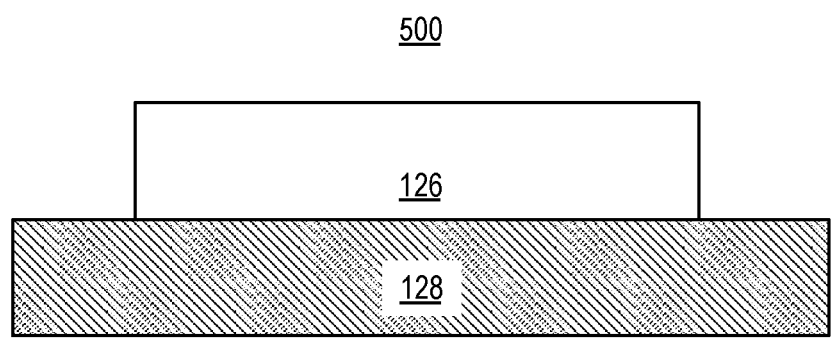
FIG. 5B illustrates a cross sectional view of the bonded substrate (including the insulator layer and the semiconductor substrate) in FIG. 5A, following patterning of the semiconductor substrate.

FIG. 5B illustrates a cross sectional view of the bonded substrate 500 (including the insulator layer 126 and the semiconductor substrate 126) in FIG. 5, following patterning of the semiconductor substrate 126. In an exemplary embodiment, the semiconductor substrate 126 is patterned to form a fin structure 126.

Figure 5C:
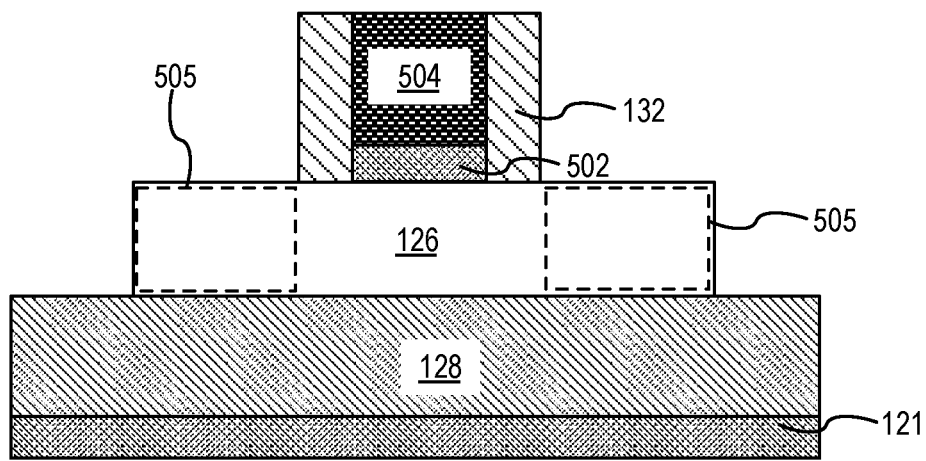
FIG. 5C illustrates a cross sectional view of the structure of FIG. 5B following the formation of a dummy gate dielectric on the fin structure, formation of a dummy gate on the dummy gate dielectric layer and the formation of dielectric spacer adjacent to the dummy gate dielectric layer and adjacent to the dummy gate.

FIG. 5C illustrates a cross sectional view of the structure of FIG. 5B following the formation of a dummy gate dielectric 502 on the fin structure 126, formation of a dummy gate 504 on the dummy gate dielectric 502 and the formation of dielectric spacer 132 adjacent to the dummy gate dielectric 502 and the dummy gate 504. In an embodiment, a dummy gate dielectric layer is deposited on the fin structure 126. Subsequently a layer of dummy gate material is deposited on the dummy gate dielectric layer. In an embodiment, the dummy gate dielectric layer includes a layer of material such as but not limited to silicon dioxide or silicon carbide and the dummy gate material includes a layer of material such as a doped polysilicon. In an embodiment, a mask is formed on the layer of dummy gate material. In some embodiments, the layer of dummy gate material is subsequently patterned by a plasma etch process and the dummy gate dielectric layer is patterned using a wet etch removal to form a dummy gate 504 on the dummy gate dielectric 502. A dielectric spacer layer is then deposited on the dummy gate 504 and on the fin structure 126. In an embodiment, the dielectric spacer layer is then patterned using a plasma etch process to form dielectric spacer 132, as illustrated in FIG. 5C. In some embodiments, the portions of the fin structure 126, indicated by dashed lines 505, may be etched after formation of the dielectric spacer 132.

Figure 5D:
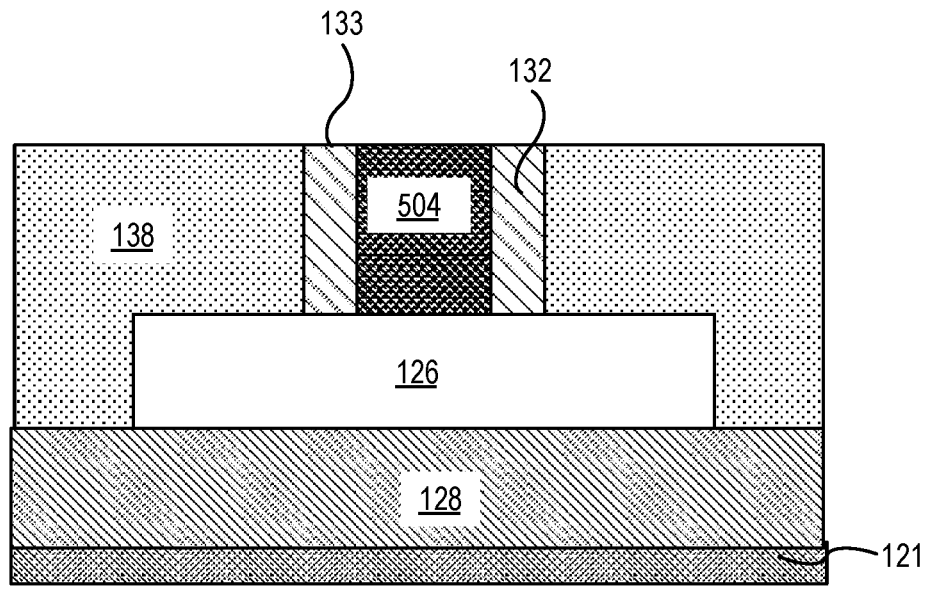
FIG. 5D illustrates a cross sectional view of the structure of FIG. 5C following the deposition of a dielectric layer and following a planarization of the dielectric layer, upper portions of the dielectric spacer and upper portions of the dummy gate.

FIG. 5D illustrates a cross sectional view of the structure of FIG. 5C following the deposition of a dielectric layer 138 and following a planarization of the dielectric layer 138, upper portions of the dielectric spacer 132 and upper portions of the dummy gate 504. In an embodiment, the planarization process is a chemical mechanical polish (CMP) process. The CMP process is utilized to polish the dielectric layer 138, the upper portions of the dielectric spacer 132 and upper portions of the dummy gate 504. In one embodiment, the CMP process results in substantially flat uppermost dielectric spacer surface 133. Furthermore, in one such embodiment, the CMP process results in uppermost dielectric spacer surface 133, uppermost surface of the dummy gate 504 and uppermost surface of dielectric layer 138 being co-planar or substantially co-planar.

Figure 5E:
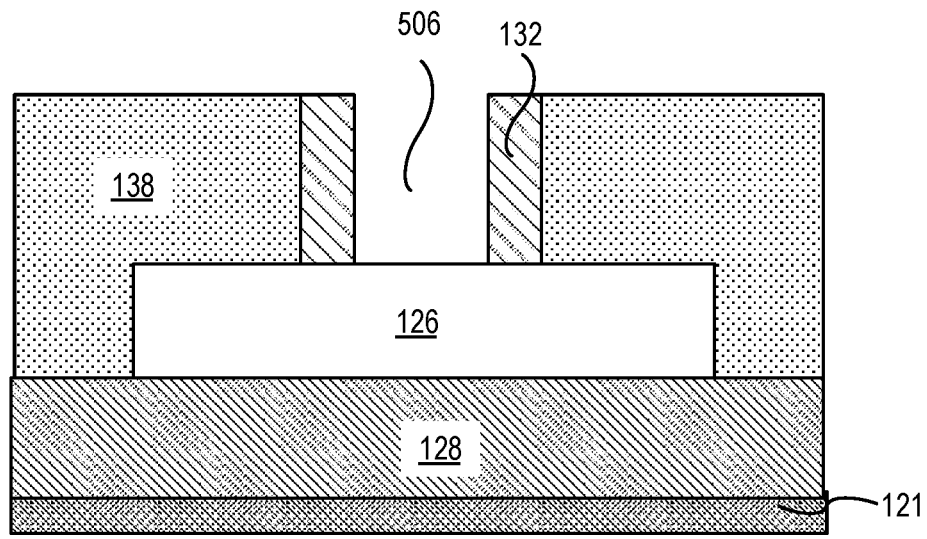
FIG. 5E illustrates a cross sectional view of the structure of FIG. 5D following removal of the dummy gate and of the dummy gate dielectric selectively to the underlying fin structure.

FIG. 5E illustrates a cross sectional view of the structure of FIG. 5E following removal of the dummy gate 504 and of the dummy gate dielectric 502 selectively to the underlying fin structure 126. In an embodiment, dummy gate 504 is removed by an etch process that was utilized to pattern the dummy gate 504 in the first instance, and the dummy gate dielectric layer 502 is removed by the wet process utilized in patterning the dummy gate dielectric layer 502, as discussed above. As shown, removal of the dummy gate 504 and the dummy gate dielectric layer 502 creates an opening 506.

Figure 5F:
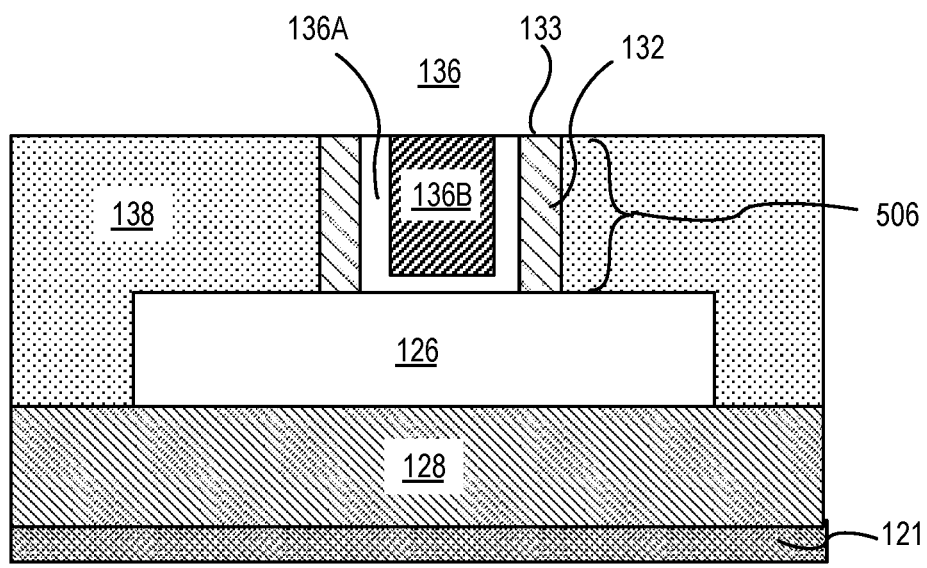
FIG. 5F illustrates the structure of FIG. 5E following a deposition of a gate dielectric layer on a top surface of the fin structure within opening, on sidewalls of dielectric spacer, and on a top or uppermost surface of the dielectric layer.

FIG. 5F illustrates the structure of FIG. 5E following the formation of a gate dielectric layer 136A into opening 506, and a gate electrode 136B on the gate dielectric layer 136A. In some embodiments, the gate dielectric layer 136A is blanket deposited into the opening 506, on a top surface of the fin structure 126 within opening 506, on sidewalls of dielectric spacer 132 within opening 506, on dielectric spacer surface 133, and on a top or uppermost surface of the dielectric layer 138. In an embodiment, gate dielectric layer 136A is deposited by an atomic layer deposition process (ALD) process to ensure conformal deposition within the opening 506. A conformal deposition process, for example, may provide a film with a uniform thickness at an interface with an uppermost surface of the fin structure 126. The gate dielectric layer 136A may be deposited to a thickness in the range of 1 nm-10 nm.

In an embodiment, a gate electrode layer is blanket deposited on the gate dielectric layer 136A by an atomic layer deposition process (ALD) process to ensure conformal deposition in opening 506 and over the fin structure 126 (i.e., on Gate dielectric layer 136A). In other embodiments, a physical vapor deposition process is utilized. In some embodiments, depositing a gate electrode layer may include depositing a stack of two or more conductive layers, where a first conductive layer that is directly on the gate dielectric layer 136A sets the work function of the gate electrode (to be formed), and the remaining one or more conductive layers include fill layers. The fill layers provide protection to the work function electrode during a subsequent planarization process.

After deposition of the gate electrode layer, a planarization may be performed to form gate electrode 136B and gate dielectric layer 136A in the opening 506. In an embodiment, the planarization process includes a CMP process. In an embodiment, uppermost surfaces of gate electrode 136B and gate dielectric layer 136A are co-planar or substantially co-planar with the uppermost surface of dielectric layer 138. Co-planarity is advantageous to minimize height variation between transistors.

Figure 5G:
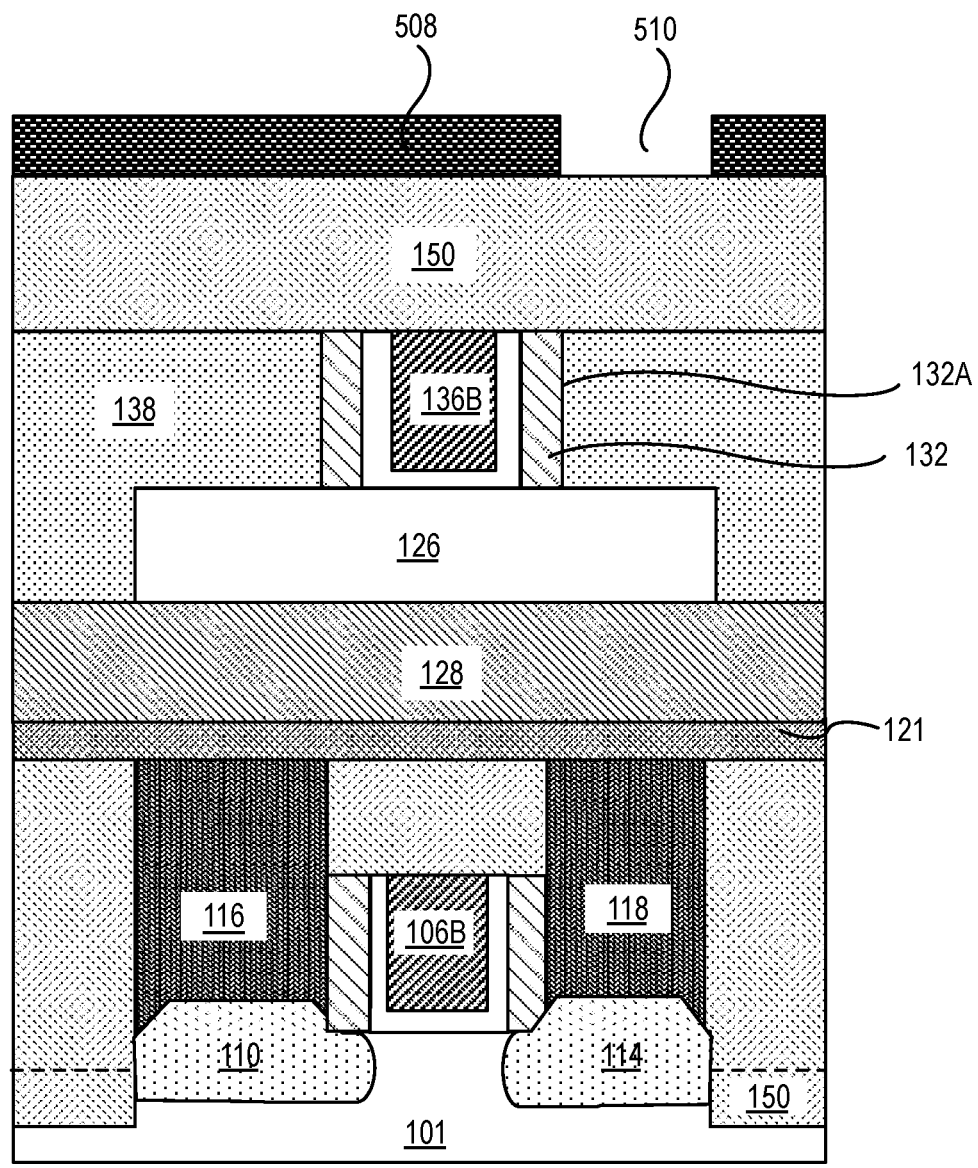
FIG. 5G illustrates the structure of FIG. 5F following the formation of a dielectric layer and followed by the formation of a mask on the dielectric layer.

FIG. 5G illustrates the structure of FIG. 5F following the formation of a dielectric layer 150 on the dielectric layer 128 and following the formation of a mask 508 on the dielectric layer 150. In an embodiment, an opening 510 is formed in the mask 508, where one side of the opening 510 is aligned with spacer sidewall surface 132A.

Figure 5H:
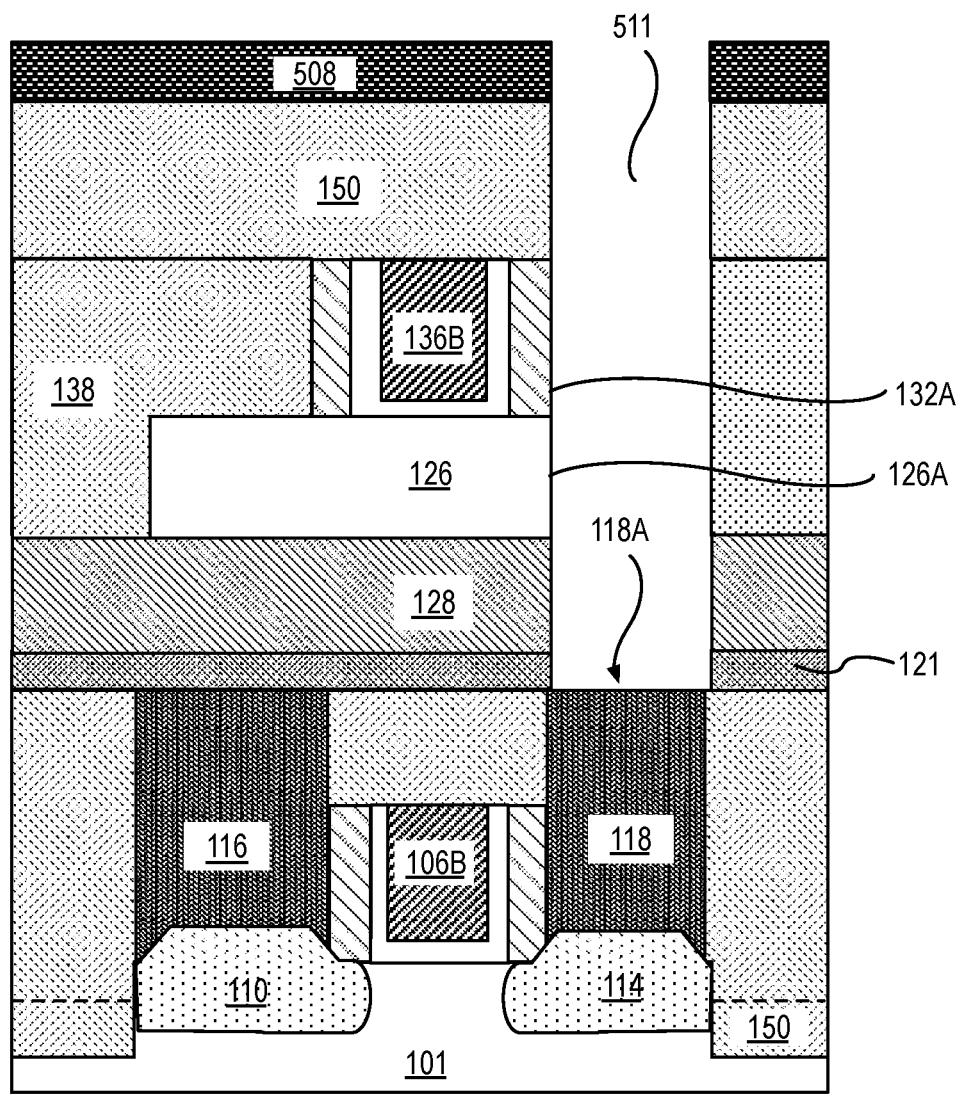
FIG. 5H illustrates the structure of FIG. 5G following the formation of an opening in the dielectric layers and, following etching of a portion of the fin structure exposed by opening and following etching of the insulator layer and etch stop layer.

FIG. 5H illustrates the structure of FIG. 5G following the formation of an opening 511 in the dielectric layers 150 and 138, following etching of a portion of the fin structure exposed by opening 510 and following etching of the insulator layer 128 and etch stop layer 121. In some embodiments, the dielectric layers 150 and 138 are patterned by a plasma etch process that exposes a portion of the fin structure 126. The spacer sidewall surface 132A may also be exposed, as shown, in some instances when the opening 510 in the mask 508 is aligned with the spacer sidewall surface 132A.

The exposed portion of the fin structure 126 maybe subsequently etched by a plasma etch processing including chemical etchants that are different compared to plasma etchants utilized for patterning the dielectric layers 150 and 138. In the illustrative embodiment, the patterned fin structure sidewall 126A has a vertical profile. In other embodiments, the patterned fin structure sidewall 126A may have a tapered profile or be slightly notched under the dielectric spacer 132. The plasma etch process concludes by etching the insulator layer 128 and etch stop layer 121 and exposing the terminal structure 118. In an embodiment, the insulator layer 128 may be etched by a plasma etch process similar to the etch process utilized to etch dielectric layer 150. In an embodiment, a lowermost portion of the etch stop layer 121 covering a terminal structure surface 118A may be left unpatterned. Depending on the material of the terminal structure 118, the lowermost portion of the etch stop layer 121 may be subsequently patterned by utilizing etchants that are not reactive to the material of the underlying terminal structure 118. As such, the sidewall profile of the etch stop layer 121 may not be vertical but flared or gradually sloped. In some embodiments, for minimizing contact resistance it is desirable that the uppermost terminal surface 118A be fully exposed during the etch process.

Figure 5I:
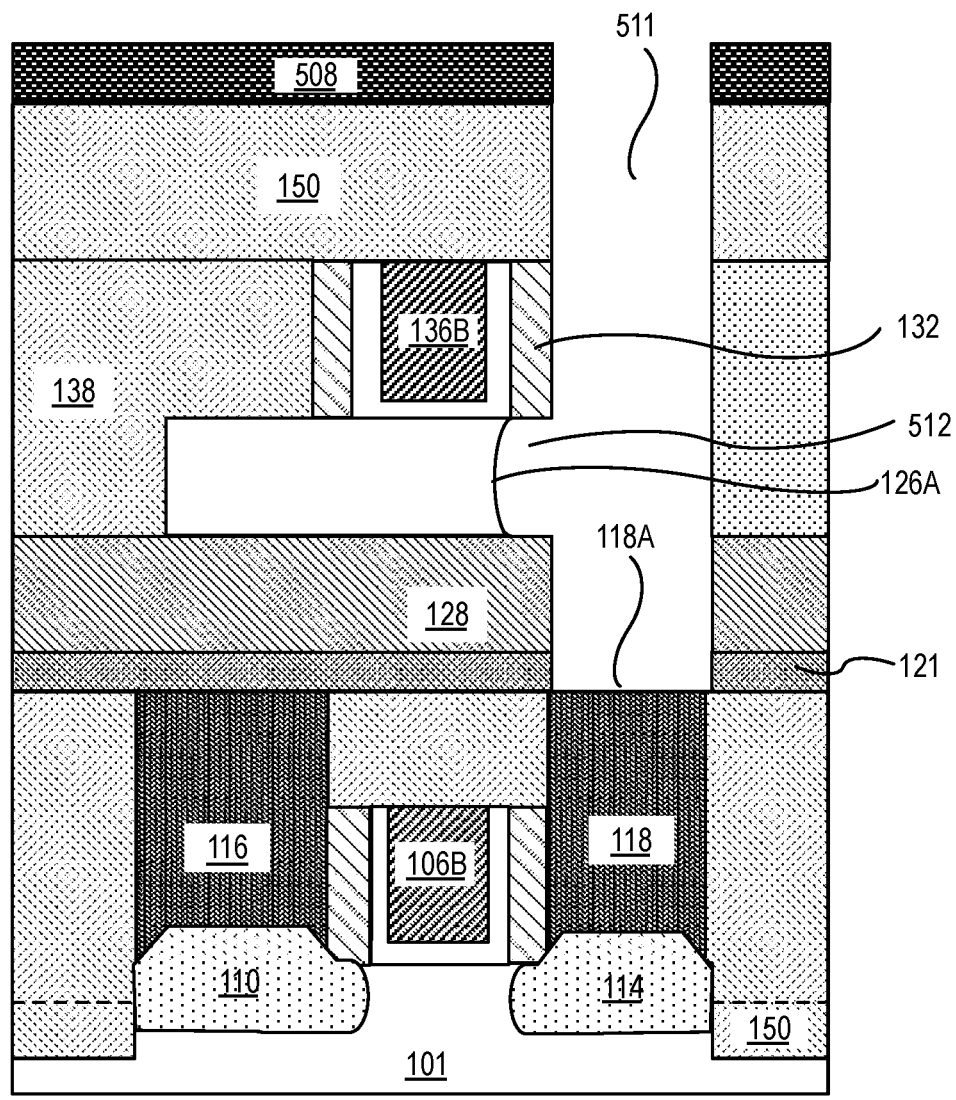
FIG. 5I illustrates the structure of FIG. 5H following a lateral recess of a fin structure sidewall.

FIG. 5I illustrates the structure of FIG. 5H following a lateral recess of fin structure sidewall 126A. In an embodiment, a plasma etch having an isotropic component may be utilized to form a recess 512 in the fin structure 126. Depending on the duration of the plasma etch and energy of the reactants, recess 512 may extend below the dielectric spacer 132 in some examples or extend further below a portion of the gate 136 in other instances. The isotropic component of the plasma etch process may transform the fin structure sidewall 126A (in FIG. 5H) that is a substantially vertical, into a fin structure sidewall 126A that has a concave surface, as shown. In the illustrative embodiment, the concaved fin structure sidewall 126A has a portion under the gate dielectric layer 136A and gate electrode 136B. In exemplary embodiments, the plasma etch process is highly selective to the dielectric spacer 132, the insulator layer 128, the dielectric layers 150 and 138 as well as to the material of the uppermost terminal surface 118A.

It is to be appreciated that fin structure sidewall 126A may be recessed prior to etching the lowermost portion of the etch stop layer 121 or prior to exposing uppermost terminal surface 118A.

Figure 5J:
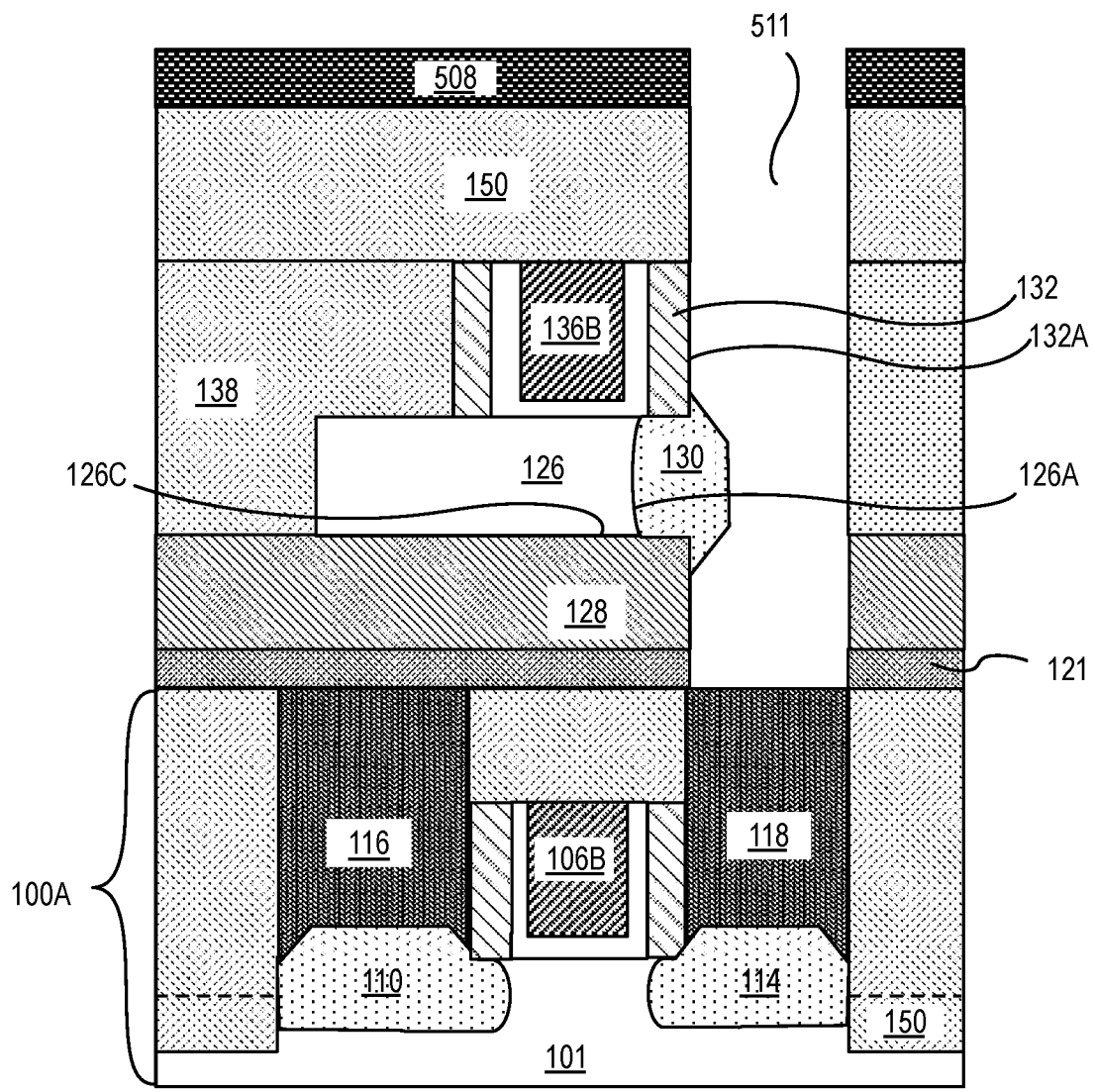
FIG. 5J illustrates the structure of FIG. 5I following formation of an epitaxial structure on the fin structure sidewall.

FIG. 5J illustrates the structure of FIG. 5I following formation of an epitaxial structure 130 on the fin structure sidewall 126A. Structure 130 may induce strain in a channel of the fin structure 126. The epitaxial structure 130 may be formed by an epitaxial deposition process. For examples where, compressive strain is advantageous the epitaxial structure 130 includes a silicon germanium material. The epitaxial deposition process may range between 300-600 degrees to prevent impacting the work function of the gate electrode of the transistor 100A.

In an embodiment, the epitaxial structure 130 selectively nucleates from the fin structure sidewall 126A, and extends laterally fills the recess 512. In other embodiments, the epitaxial structure 130 laterally extends beyond the dielectric spacer 132 and the insulator 128. In some examples, such as is illustrated, the epitaxial structure 130 laterally extends beyond the dielectric spacer 132 and the insulator 128 and further extends along a portion of the dielectric spacer sidewall surface 132A and along a portion of insulator sidewall surface 128A below the lowermost fin structure surface 126C. In one such embodiment, the epitaxial structure 130 does not laterally extend over to join the dielectric layer 138. The epitaxial structure 130 may be faceted as shown in FIG. 5J when formed from a fin structure sidewall 126A having a smooth surface. In some embodiments, epitaxial structure 130 are grown to have surfaces that are irregular. During the deposition process, the material of the epitaxial structure 130 may be in-situ doped depending on the desired MOS characteristic of the transistor to be formed. Dopants may include boron, phosphorus or arsenic.

Figure 5K:
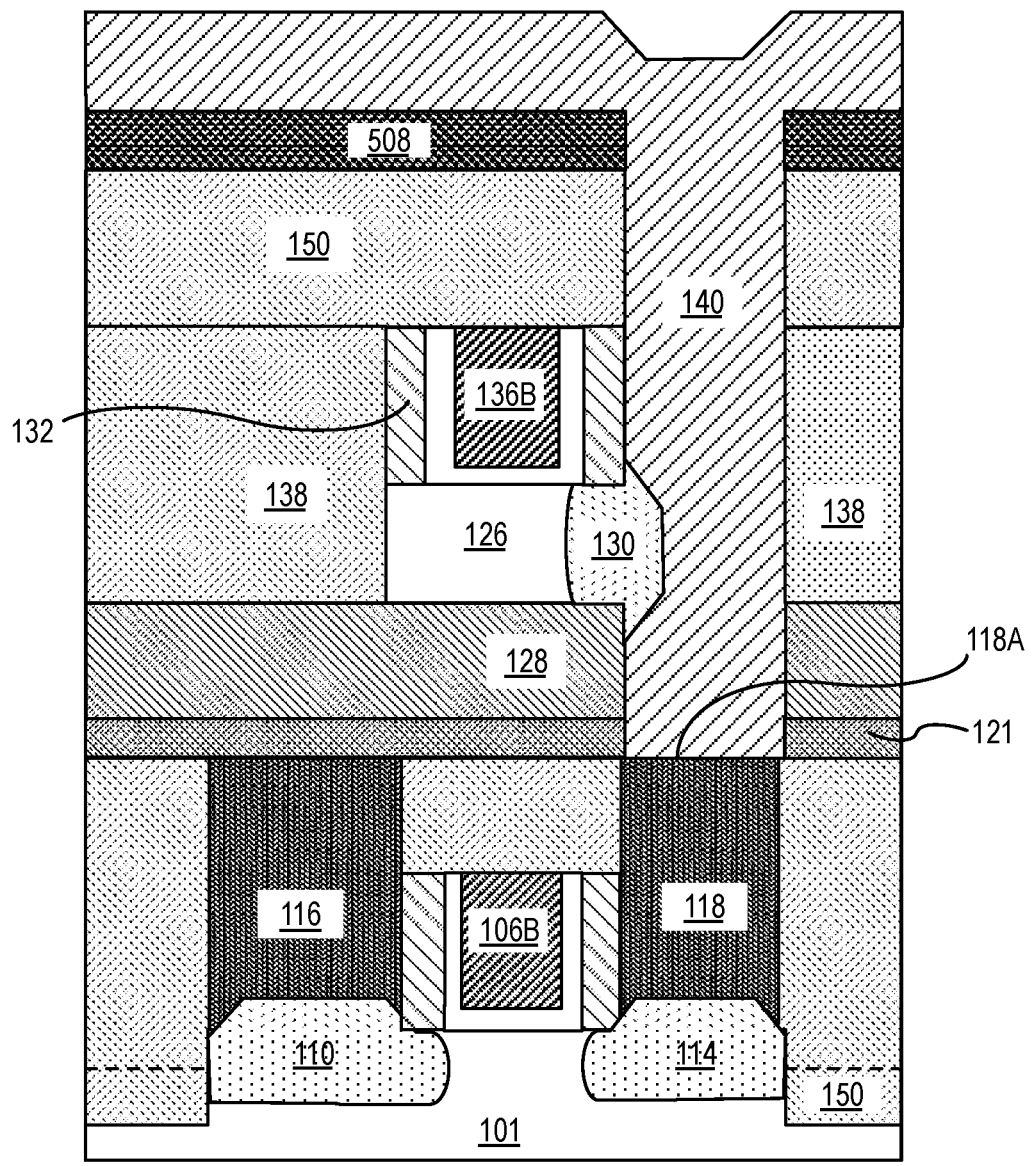
FIG. 5K illustrates the structure of FIG. 5J following the deposition of one or more layers of metals to form a metallization structure.

FIG. 5K illustrates the structure of FIG. 5J following the deposition of one or more layers of metals to form a metallization structure 144. In some embodiments, the one or more layers of metals are deposited inside the opening 511 on an uppermost terminal surface 118A. In the illustrative embodiment, the one or more layers of metals are also blanket deposited on the uppermost surface of the mask 508, on sidewalls of dielectric layers 150 and 138, on dielectric spacer sidewall surface 132A, on sidewalls of insulator layer 128, and on sidewalls of etch stop layer 121. The one or more layers of metals are also deposited on sidewalls of the epitaxial structure 130. In the illustrated embodiment, the metallization structure 144 is conformally adjacent to the epitaxial structure 130 and on sidewalls of insulator layer 128.

In some embodiments, the one or more layers of metal are deposited using a plasma enhanced chemical vapor deposition (PECVD) or an ALD process. In some embodiments, suitable metals for the metallization structure 144 include Ti, Al, Ni. In some embodiments, a tungsten capping layer is deposited on the one or more layers of metal. In some embodiments, where the tungsten capping layer is deposited on the one or more layers of metal, the one or more layers of metal is first deposited on the bottom and on the sides of the opening 511 and the tungsten capping layer is deposited to fill the remaining portion of the opening 511. In some embodiments, the one or more layers of metal is deposited to a thickness in the range of 10-30 nm, and the tungsten capping layer is deposited to fill the remaining portion of the opening 511.

Figure 5L:
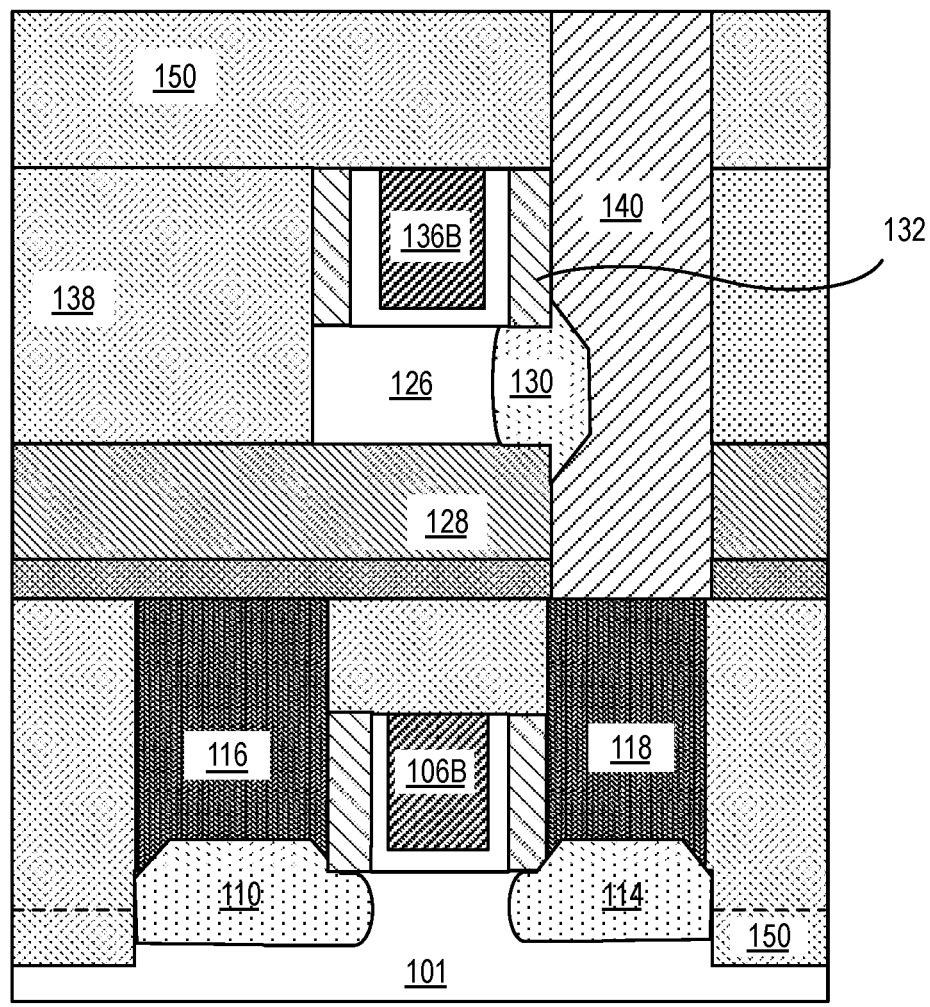
FIG. 5L illustrates the structure of FIG. 5K following the planarization of uppermost portions of the metallization structure.

FIG. 5L illustrates the structure of FIG. 5K following the planarization of uppermost portions of the metallization structure 140. In one embodiment, the planarization process includes a chemical mechanical polish (CMP) process. The CMP process removes all the one or more layers of metal of the metallization structure 140 from the uppermost surfaces of the mask 508. In some embodiments, the planarization process is continued until the mask 508 is also removed, as shown.

Figure 5M:
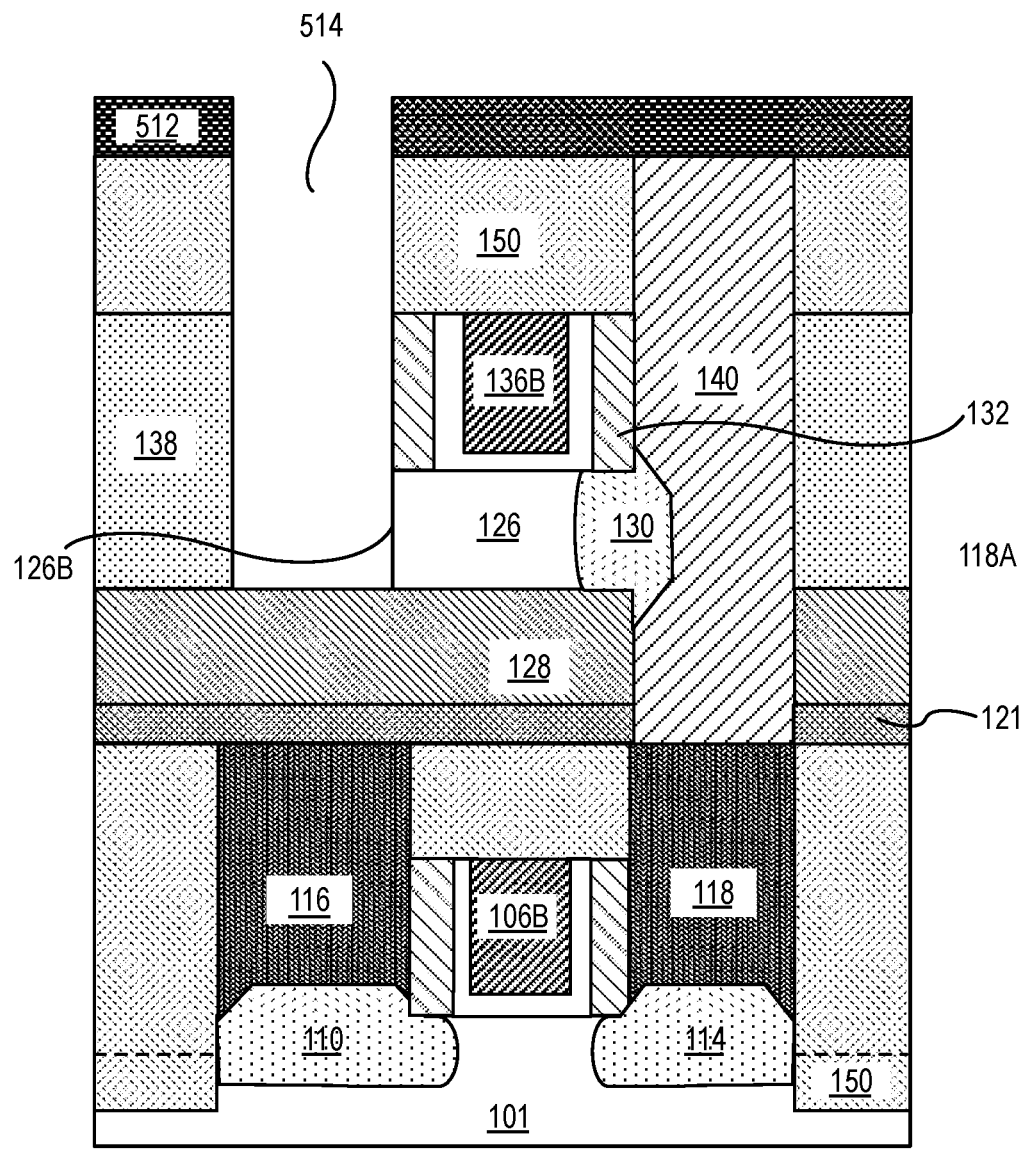
FIG. 5M illustrates the structure of FIG. 5L following the formation of a mask, and an opening that will be subsequently utilized to form a second epitaxial structure.

FIG. 5M illustrates the structure of FIG. 5L following the formation of a mask 512, and an opening 514 that will be subsequently utilized to form a second epitaxial structure. In an embodiment, mask 512 is formed by a process that is substantially similar to the process utilized to form mask 508. In the illustrative embodiment, mask 512 includes a material that is the same or substantially the same as the material of the mask 508. In an embodiment, the opening 514 is formed in substantially the same manner as the opening 511. In the illustrative embodiment, the opening 514 etches a portion of the fin structure 126, forms a fin structure sidewall 126B and stops on the insulator layer 128. In some embodiments, the insulator layer 128 is partially or fully etched. In some such embodiments where the insulator layer 128 is fully etched, the etch stop layer 128 remains unetched. It is to be appreciated that some misalignment may occur while patterning the opening 514. In such instances, portions of the dielectric spacer 132 above the fin structure sidewall 126B may be etched. In other examples, a thin lining of the dielectric layer 138 may form adjacent to the dielectric spacer 132.

Figure 5N:
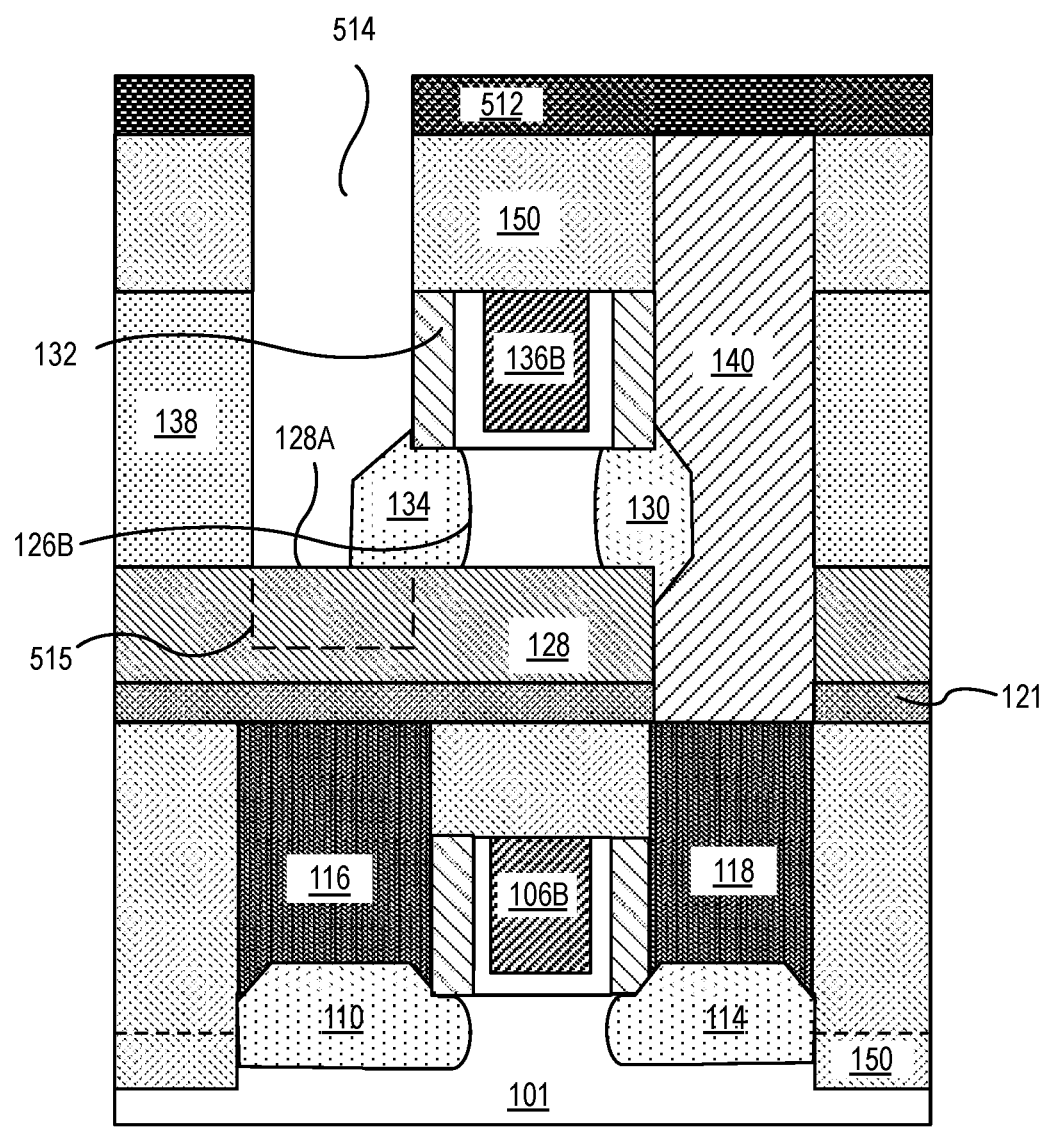
FIG. 5N illustrates the structure of FIG. 5M following the formation of epitaxial structure after the formation of a sidewall recess in the fin structure.

FIG. 5N illustrates the structure of FIG. 5M following the formation of epitaxial structure 134 after the formation of a sidewall recess in the fin structure 126. In some embodiments, the fin structure sidewall 126B may have a sidewall shape similar to a shape of the fin structure sidewall 126A. In other embodiments, the fin structure sidewall 126B may have a profile that is more concaved that the fin structure sidewall 126A due to the presence of the insulator layer surface 128A. It is to be appreciated that since the fin structure sidewall 126B is formed independently from fin structure sidewall 126A, epitaxial structure 134 may not be symmetrically formed around a horizontal axis of the fin structure 126. In an embodiment, the epitaxial structure 134 is formed in a same manner or substantially the same manner as the epitaxial structure 130.

As illustrated, the epitaxial structure 134 has a profile as described above in association with FIG. 1A. In other embodiments, where the insulator layer 128 is also fully or partially etched (with a profile defined by dashed line 515) during formation of the opening 514, the epitaxial structure 134 has a profile similar to the epitaxial structure 130. In some embodiments, the fin structure sidewall 126B may be more or less recessed under the dielectric spacer 132 than the fin structure sidewall 126A. In the illustrated embodiment, the epitaxial structure 134 is grown to have a flat lowermost surface that extends laterally on to an uppermost insulator layer surface 128A. In some embodiments, the epitaxial structure 134 may be grown to extend all the way to a sidewall of the adjacent dielectric layer 138 in the opening 514.

Figure 5O:
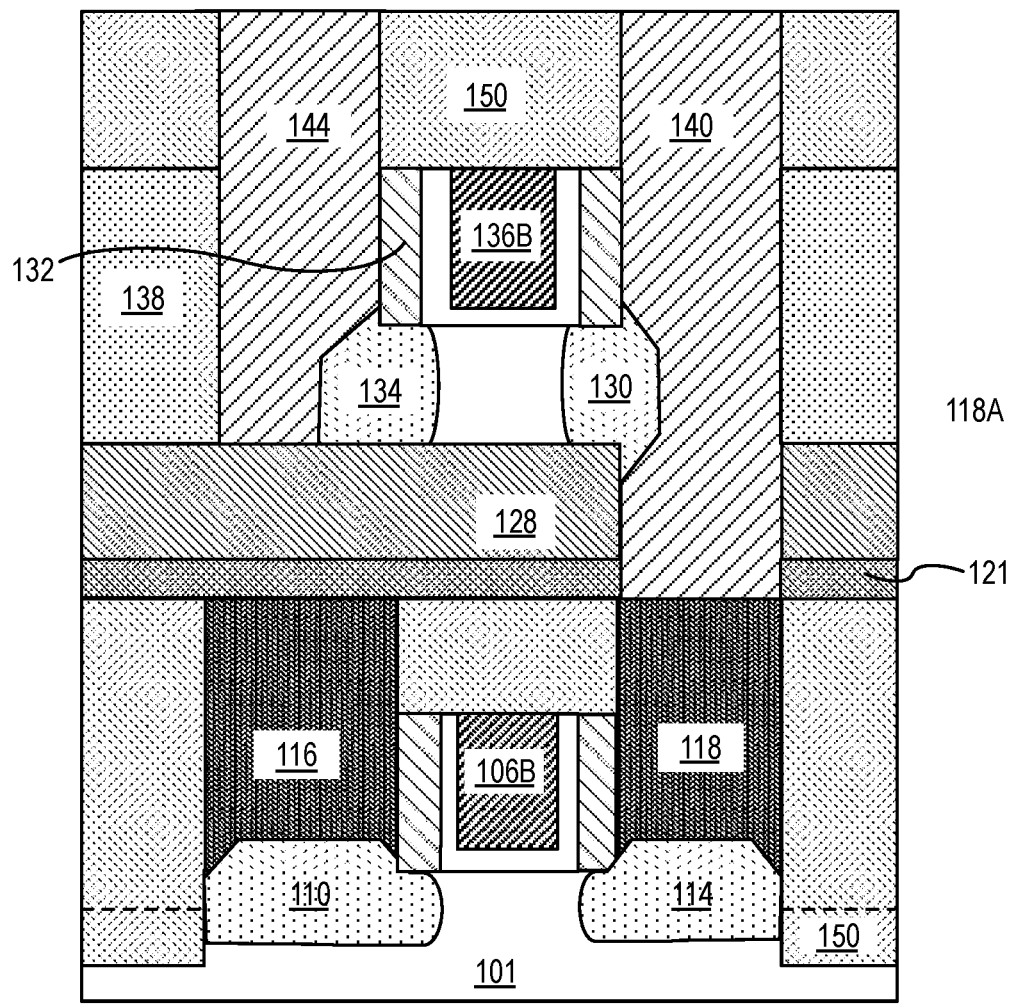
FIG. 5O illustrates the structure of FIG. 5N following the formation of a metallization structure in the opening.

FIG. 5O illustrates the structure of FIG. 5N following the formation of a metallization structure 144 in the opening 514. In an embodiment, the metallization structure 144 includes materials that are the same as the materials of the metallization structure 140 and is planarized in a manner similar to planarization performed to form metallization structure 140.

Figure 6A:
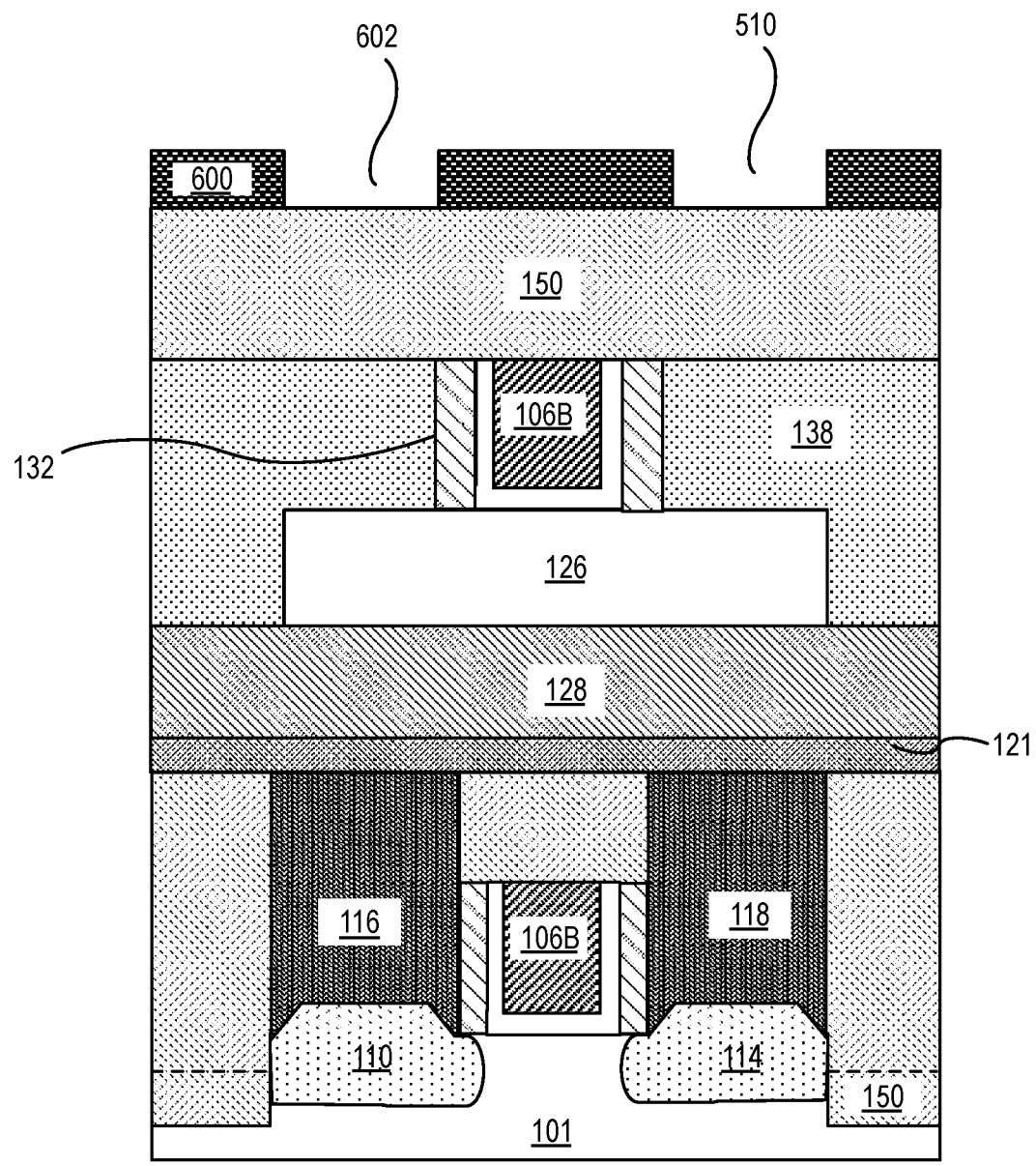
FIG. 6A illustrates an alternative embodiment to the structure in FIG. 5G, where a second opening is formed in addition to the first opening described in association with FIG. 5G.

FIG. 6A illustrates an alternative embodiment to the structure in FIG. 5G, where a second opening 602 is formed in addition to the first opening 510 described in association with FIG. 5G.

Figure 6B:
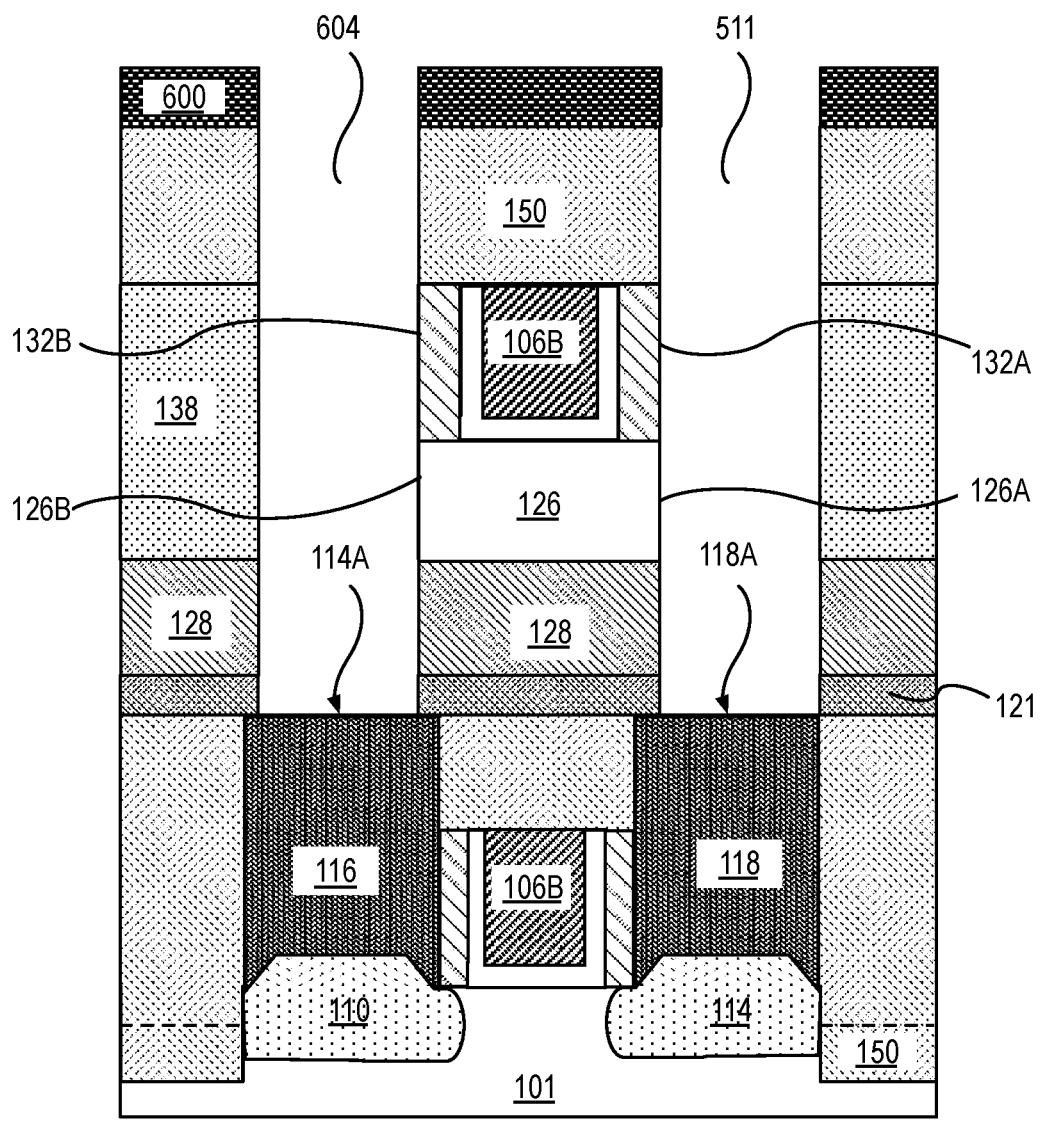
FIG. 6B illustrates the structure of FIG. 6A following the formation of a plurality of openings in the dielectric layers, fin structure, insulator and etch stop layer to expose uppermost surfaces of terminal structures.

FIG. 6B illustrates the structure of FIG. 6A following the formation of openings 511 and 604. Openings 511 and 604 etch exposed portions of the fin structure 126 and simultaneously form sidewalls 126A and 126B. In the illustrative embodiment, a plasma etch process that is utilized to form openings 511 and 604, also etch the insulator layer 138 and the etch stop 121. In some such embodiments, opening 511 exposes uppermost terminal surface 118A and the opening 604 exposes uppermost terminal surface 114A. It is to be appreciated that slight misalignment between mask 600 and the fin structure 126 may cause fin structure sidewall 126B to be offset from dielectric spacer sidewall 132B. A similar offset may occur between the fin structure sidewall 126A and the dielectric spacer sidewall 132A. In some embodiments, misalignment may cause the fin structure sidewall 126B to be aligned with dielectric spacer sidewall 132B, but cause the fin structure sidewall 126A to become offset from the dielectric spacer sidewall 132A.

Figure 6C:
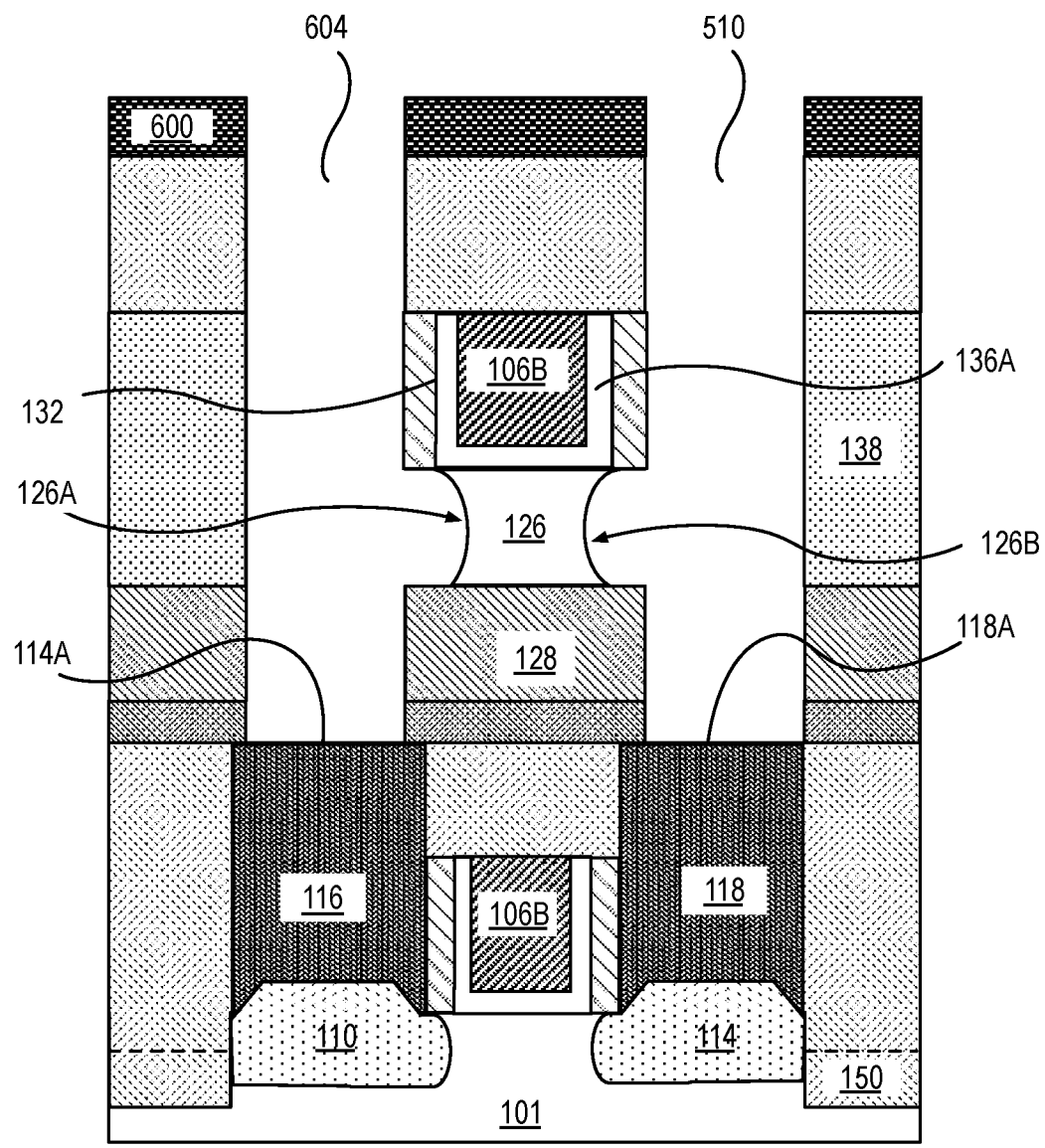
FIG. 6C illustrates the structure of FIG. 6B following the process to recess fin structure sidewalls.

FIG. 6C illustrates the structure of FIG. 6B following the process to recess fin structure sidewalls 126A and 126B. In an embodiment, the process utilized to form recess is the same as the process described above in association with FIG. 5I. In the illustrative embodiment, the fin structure sidewall 126A and the fin structure sidewall 126B are recessed laterally under the dielectric spacer 132 and under the gate dielectric layer 136A. In an exemplary embodiment, the recesses in the fin structure are substantially symmetric. In other examples, the shapes of the fin structure sidewall 126A and the fin structure sidewall 126B may be asymmetrical. In some examples, the fin structure sidewall 126A may laterally recess under the dielectric spacer 132 and the gate dielectric layer 136A by an amount that is slightly greater or less compared to a lateral recess of the fin structure sidewall 126B from under the dielectric spacer 132 and the gate dielectric layer 136A. Asymmetry may result when there is some misalignment between the mask 600 and the fin structure 126 as described above.

Figure 6D:
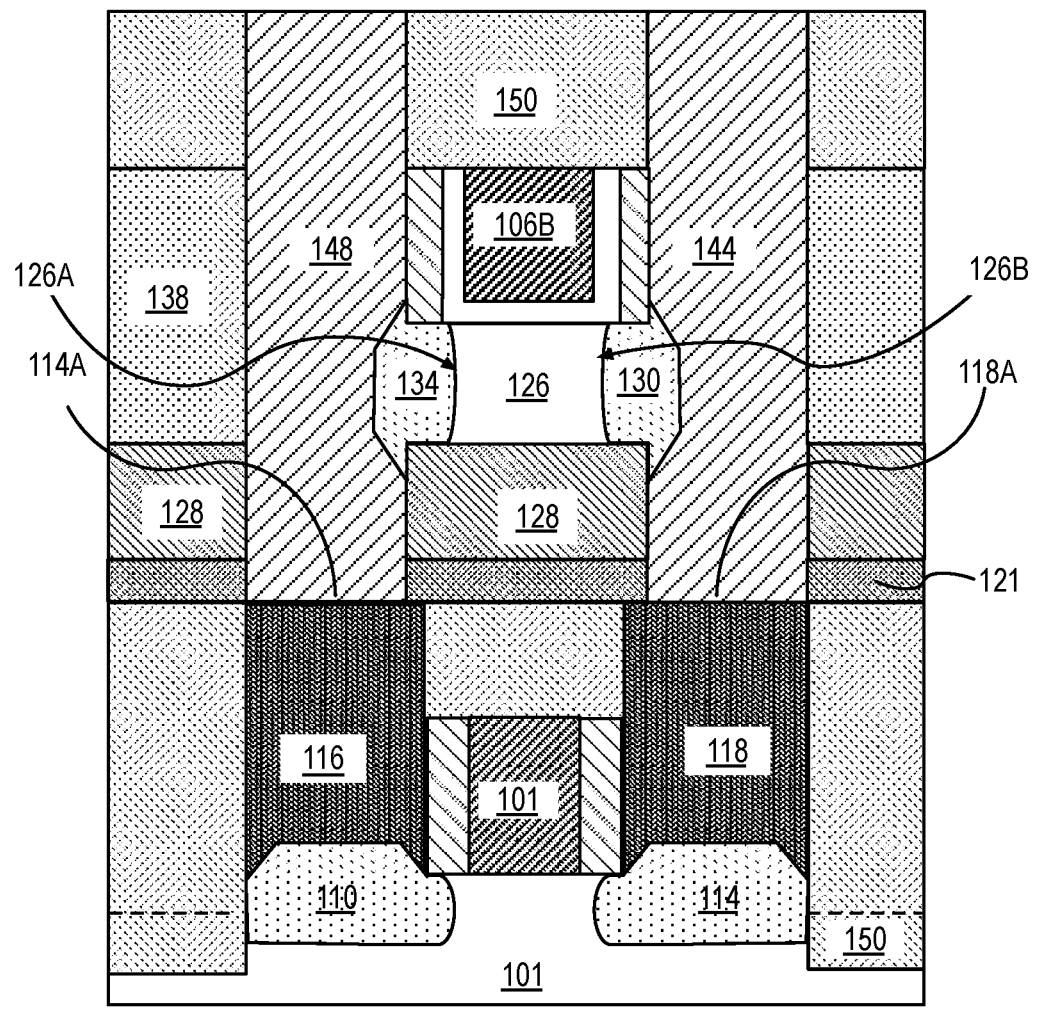
FIG. 6D illustrates the structure of FIG. 6C following the formation of a plurality of epitaxial structures and metallization structures.

FIG. 6D illustrates the structure of FIG. 6C following the formation of metallization structures 148 and 144. Formation of the metallization structures 148 and 144 may be carried out using processes and materials described above in association with FIGS. 5K-5L.

FIG. 7A illustrates a cross-sectional view of a memory cell 700 including a device structure 100 with transistors 100A and 100B, and a non-volatile memory element 702 coupled to a metallization structure 140 of the transistor 100B. Memory cell 700 further includes metallization structure 140 coupled with the epitaxial structure 134, a gate metallization structure 736 coupled with the gate 136, and a memory contact 730 coupled with the non-volatile memory element 702. In an embodiment, metallization structure 140, gate metallization structure 736 and non-volatile memory element 702 are embedded in a dielectric layer 732. In an embodiment, the gate metallization structure 736 includes a material that is the same or substantially the same as the metallization structure 140. In an embodiment, dielectric layer 732 includes a material that is the same or substantially the same as dielectric layer 138.

Non-volatile memory element 702 may include a magnetic tunnel junction (MTJ) material device, a conductive bridge random access memory (CBRAM) device, or a resistive random-access memory (RRAM) device. A non-volatile memory element such as an MTJ device requires a nominal critical switching current, that depends on an MTJ device area, to undergo magnetization switching. As an MTJ is scaled down in size, the critical switching current required to switch the memory state of the MTJ device also scales proportionally with device area, however scaling MTJ's presents numerous challenges. If a device structure 100 connected to an MTJ device can deliver an amount of current that exceeds critical switching current requirement of the MTJ device, then scaling of MTJ devices can be relaxed. In an embodiment, transistor 100B, which can provide an additional current boost (through increase in drive current resulting from epitaxial structures 130 and 134), can be advantageously coupled to non-volatile memory element 702 such as an MTJ device to overcome any larger critical switching current requirements.

FIG. 7B illustrates a cross-sectional view of an example non-volatile memory element 702 that includes a magnetic tunnel junction (MTJ) material device. In the illustrated embodiment, the MTJ device includes a bottom electrode 704, a fixed magnet 706 above the bottom electrode 704, a tunnel barrier 708 on the fixed magnet 706, a free magnet 710 on the tunnel barrier 708, and a top electrode 712 on the free magnet 710. In an embodiment, a dielectric spacer laterally surrounds (not shown) non-volatile memory element 702.

In an embodiment, fixed magnet 706 includes a material and has a thickness sufficient for maintaining a fixed magnetization. For example, fixed magnet 706 may include an alloy such as CoFe and CoFeB. In an embodiment, fixed magnet 706 includes $Co_{100-x-y}Fe_xB_y$, where X and Y each represent atomic percent such that X is in the range of 50-80 and Y is in the range of 10-40, and the sum of X and Y is less than 100. In an embodiment, X is 60 and Y is 20. In an embodiment, fixed magnet 706 is FeB, where the concentration of boron is between 10-40 atomic percent of the total composition of the FeB alloy. In an embodiment, the fixed magnet 706 has a thickness that is in the range of 1 nm-2.5 nm.

In an embodiment, tunnel barrier 708 is composed of a material suitable for allowing electron current having a majority spin to pass through tunnel barrier 708, while impeding, at least to some extent, electron current having a minority spin from passing through tunnel barrier 708. Thus, tunnel barrier 708 (or spin filter layer) may also be referred to as a tunneling layer for electron current of a particular spin orientation. In an embodiment, tunnel barrier 708 includes a material such as, but not limited to, magnesium oxide (MgO) or aluminum oxide ($Al_2O_3$). In an embodiment, tunnel barrier 708 including MgO has a crystal orientation that is (001) and is lattice matched to free magnet 710 below tunnel barrier 708 and fixed magnet 706 above tunnel barrier 708. In an embodiment, tunnel barrier 708 is MgO and has a thickness in the range of 1 nm to 2 nm.

In an embodiment, free magnet 710 includes a magnetic material such as Co, Ni, Fe or alloys of these materials. In an embodiment, free magnet 710 includes a magnetic material such as FeB, CoFe and CoFeB. In an embodiment, free magnet 710 includes a $Co_{100-x-y}Fe_xB_y$, where X and Y each represent atomic percent such that X is between 50-80 and Y is between 10-40, and the sum of X and Y is less than 100. In an embodiment, X is 60 and Y is 20. In an embodiment, free magnet 710 is FeB, where the concentration of boron is between 10-40 atomic percent of the total composition of the FeB alloy. In an embodiment, free magnet 710 has a thickness that is in the range of 1 nm-2.5 nm.

In an embodiment, bottom electrode 704 includes an amorphous conductive layer. In an embodiment, bottom electrode 704 is a topographically smooth electrode. In an embodiment, bottom electrode 704 includes a material such as W, Ta, TaN or TiN. In an embodiment, bottom electrode 704 is composed of Ru layers interleaved with Ta layers. In an embodiment, bottom electrode 704 has a thickness in the range of 20 nm-50 nm. In an embodiment, top electrode 712 includes a material such as W, Ta, TaN or TiN. In an embodiment, top electrode 712 has a thickness in the range of 70-70 nm. In an embodiment, bottom electrode 704 and top electrode 712 are the same metal such as Ta or TiN.

In an embodiment, the MTJ device has a combined total thickness of the individual layers in the range of 60 nm-100 nm and a width in the range of 10 nm and 50 nm.

In an embodiment, non-volatile memory element 702 is a resistive random-access memory (RRAM) that operates on the principle of filamentary conduction. When an RRAM device undergoes an initial voltage breakdown, a filament is formed in a layer known as a switching layer. The size of the filament depends on the magnitude of the breakdown voltage and reliable switching between different resistance states in a filamentary RRAM device can be greatly enhanced at larger current. In an embodiment, transistor 100, that can provide an additional current boost (through increase in drive current), can be advantageously coupled to an RRAM device to provide reliable switching operation.

FIG. 7C illustrates a cross-sectional view of an example non-volatile memory element 702 that includes a resistive random-access memory (RRAM) device. In the illustrated embodiment, the RRAM material stack includes a bottom electrode 714, a switching layer 716 over the bottom electrode 714, an oxygen exchange layer 718 over the switching layer 716, and a top electrode 320 on the oxygen exchange layer 718.

In an embodiment, bottom electrode 714 includes an amorphous conductive layer. In an embodiment, bottom electrode 714 is a topographically smooth electrode. In an embodiment, bottom electrode 714 includes a material such as W, Ta, TaN or TiN. In an embodiment, bottom electrode 714 is composed of Ru layers interleaved with Ta layers. In an embodiment, bottom electrode 714 has a thickness in the range of 20 nm-50 nm. In an embodiment, top electrode 320 includes a material such as W, Ta, TaN or TiN. In an embodiment, top electrode 320 has a thickness in the range of 70-70 nm. In an embodiment, bottom electrode 714 and top electrode 320 are the same metal such as Ta or TiN.

Switching layer 716 may be a metal oxide, for example, including oxygen and atoms of one or more metals, such as, but not limited to Hf, Zr, Ti, Ta or W. In the case of titanium or hafnium, or tantalum with an oxidation state +4, switching layer 716 has a chemical composition, $MO_X$, where O is oxygen and X is or is substantially close to 2. In the case of tantalum with an oxidation state +5, switching layer 716 has a chemical composition, $M_2O_X$, where O is oxygen and X is or is substantially close to 5. In an embodiment, switching layer 716 has a thickness in the range of 1-5 nm.

Figure 8:
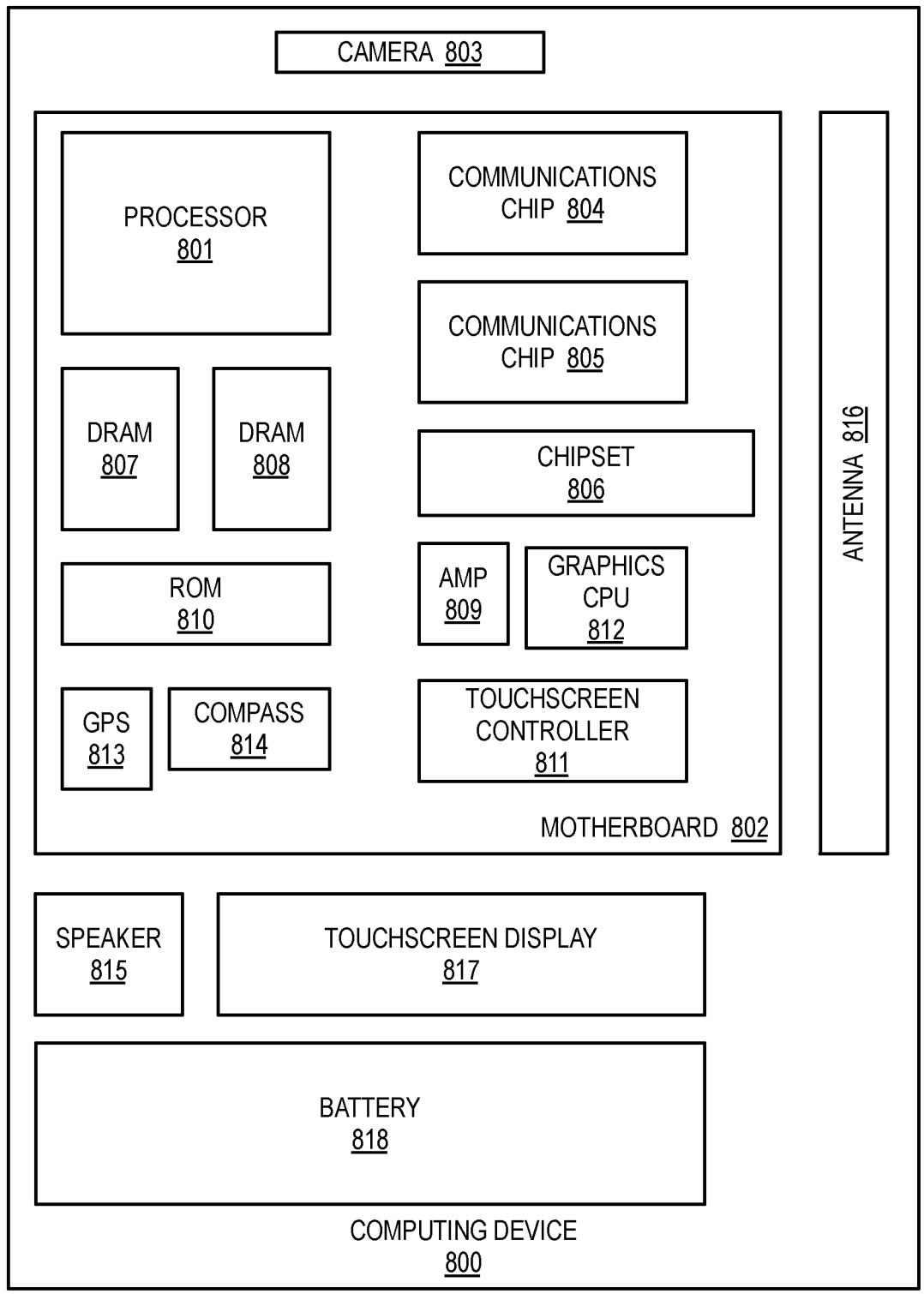
FIG. 8 illustrates a computing device in accordance with embodiments of the present invention.

Oxygen exchange layer 716 may act as a source of oxygen vacancy or as a sink for $O^{2-}$. In an embodiment, oxygen exchange layer 716 is composed of a metal such as but not limited to, hafnium, tantalum or titanium. In an embodiment, oxygen exchange layer 716 has a thickness in the range of 5-20 nm. In an embodiment, the thickness of oxygen exchange layer 716 is at least twice the thickness of switching layer 716. In another embodiment, the thickness of oxygen exchange layer 716 is at least twice the thickness of switching layer 716. In an embodiment, the RRAM device has a combined total thickness of the individual layers in the range of 60 nm-100 nm and width in the range of 10 nm and 50 nm FIG. 8 illustrates a computing device 800 in accordance with embodiments of the present disclosure. As shown, computing device 800 houses a motherboard 802. Motherboard 802 may include a number of components, including but not limited to a processor 801 and at least one communication chip 805. Processor 801 is physically and electrically coupled to the motherboard 802. In some implementations, communication chip 805 is also physically and electrically coupled to motherboard 802. In further implementations, communication chip 805 is part of processor 801.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset 806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 805 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 805 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communication chips 804 and 805. For instance, a first communication chip 805 may be dedicated to shorter range wireless communications such as Wi-Fi and Bluetooth and a second communication chip 804 may be dedicated to longer range wireless communications such as GPS, EDGE, GPRS, CDMA, WiMAX, LTE, Ev-DO, and others.

Processor 801 of the computing device 800 includes an integrated circuit die packaged within processor 801. In some embodiments, the integrated circuit die of processor 801 includes a device structure 200A, 200B, 200C or 200D having a first stressor layer 122 and a second stressor layer 126. The term "processor" may refer to any device or portion of a device that processes electronic data from registers and/or memory to transform that electronic data into other electronic data that may be stored in registers and/or memory.

Communication chip 805 also includes an integrated circuit die packaged within communication chip 806. In another embodiment, the integrated circuit die of communication chip 805 includes a memory array with memory cells including device structure 100 and a non-volatile memory device coupled to the device structure 100. The non-volatile memory device may include a magnetic tunnel junction (MTJ) device, a resistive random-access memory (RRAM) device or a conductive bridge random access memory (CBRAM) device.

In various examples, one or more communication chips 804, 805 may also be physically and/or electrically coupled to the motherboard 802. In further implementations, communication chips 804 may be part of processor 801. Depending on its applications, computing device 800 may include other components that may or may not be physically and electrically coupled to motherboard 802. These other components may include, but are not limited to, volatile memory (e.g., DRAM) 807, 808, non-volatile memory (e.g., ROM) 810, a graphics CPU 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 800 and discussed above may contain a stand-alone integrated circuit memory die that includes one or more arrays of memory cells and device structure 100, built in accordance with embodiments of the present disclosure.

In various implementations, the computing device 800 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
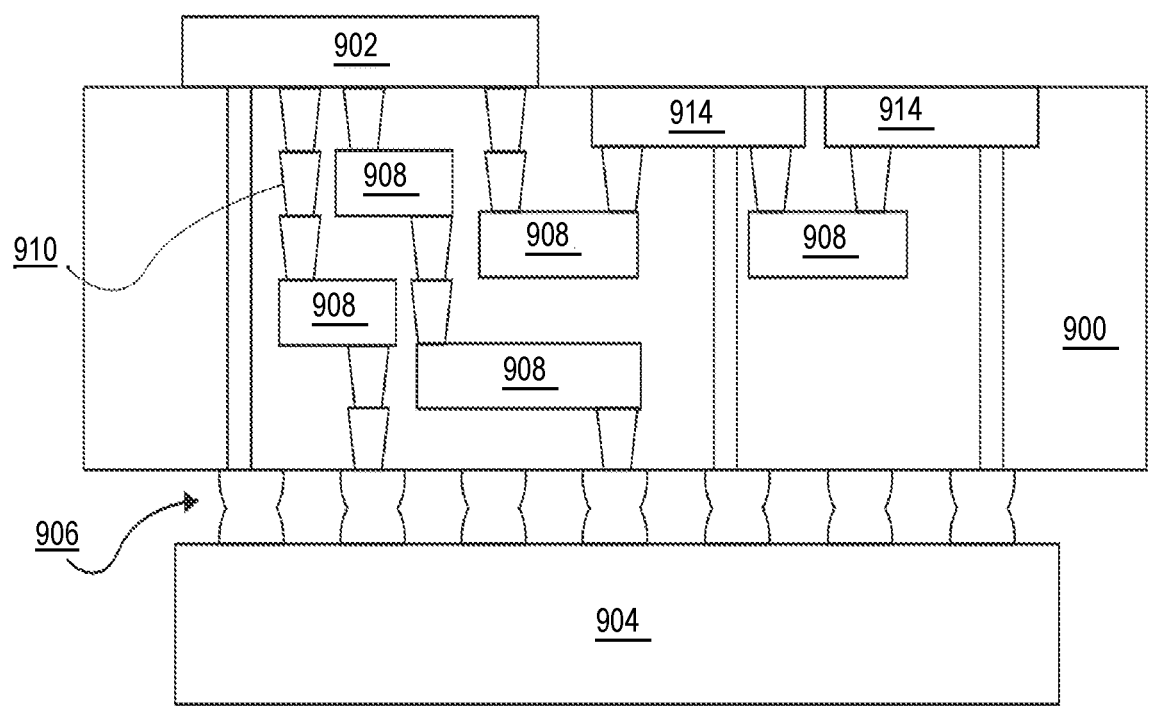
FIG. 9 illustrates an integrated circuit (IC) structure that includes one or more transistors and memory cells, all arranged in accordance with at least some embodiments of the present disclosure.

FIG. 9 illustrates an integrated circuit structure 900 that includes one or more embodiments of the disclosure. The integrated circuit (IC) structure 900 is an intervening structure used to bridge a first substrate 902 to a second substrate 904. The first substrate 902 may be, for instance, an integrated circuit die. The second substrate 904 may be, for instance, a memory module, a computer mother, or another integrated circuit die. The integrated circuit die may include one or more device systems such as a device structure including a transistor 100B and 160B with an epitaxial structure 130 and a metallization structure 140 that couples with a terminal contact 118 of a transistor 100A for example. Generally, the purpose of an integrated circuit (IC) structure 900 is to spread a connection to a wider pitch or to reroute a connection to a different connection. For example, an integrated circuit (IC) structure 900 may couple an integrated circuit die to a ball grid array (BGA) 906 that can subsequently be coupled to the second substrate 904. In some embodiments, the first and second substrates 902/904 are attached to opposing sides of the integrated circuit (IC) structure 900. In other embodiments, the first and second substrates 902/904 are attached to the same side of the integrated circuit (IC) structure 900. And in further embodiments, three or more substrates are interconnected by way of the integrated circuit (IC) structure 900.

The integrated circuit (IC) structure 900 may be formed of an epoxy resin, a fiberglass-reinforced epoxy resin, a ceramic material, or a polymer material such as polyimide. In further implementations, the integrated circuit (IC) structure 900 may be formed of alternate rigid or flexible materials that may include the same materials described above for use in a semiconductor substrate, such as silicon, germanium, and other group III-N, group III-V and group IV materials.

The integrated circuit (IC) structure 900 may include metal interconnects 908 and via 910, including but not limited to through-silicon vias (TSVs) 910. The integrated circuit (IC) structure 900 may further include embedded devices 914, including both passive and active devices. Such devices include, but are not limited to, capacitors, decoupling capacitors, resistors, inductors, fuses, diodes, transformers, device structures including transistor 100B or 160B with an epitaxial structure 130 and a metallization structure 140 that couples with a terminal contact 118 of a transistor 100A for example, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 900. In accordance with embodiments of the present disclosure, apparatuses or processes disclosed herein may be used in the fabrication of integrated circuit (IC) structure 900.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In a first example, a device structure includes a first device structure including a first body that includes a semiconductor material, and a plurality of terminals coupled with the first body. The device structure further includes an insulator between the first device structure and a second device structure, where the second device structure includes a second body including a semiconductor material. The second device structure further includes a gate coupled to the second body, a spacer including a dielectric material adjacent to the gate, an epitaxial structure adjacent to a sidewall of the second body and between the spacer and the insulator, where the epitaxial structure includes a semiconductor material different from the semiconductor material of the second body and an impurity dopant. A metallization structure is coupled to sidewall surfaces of the epitaxial structure, and further coupled with one of the terminals of the first device.

In second examples, for any of first example, the second semiconductor body includes a first group IV material and the epitaxial structure includes a compound including at least two group IV materials and a dopant.

In third examples, for any of the first through second examples, the epitaxial structure includes a first portion and a second portion, the first portion between the insulator layer and the gate and a second portion between the insulator layer and the spacer.

In fourth examples, for any of first through third examples, the epitaxial structure has a third portion extending beyond the spacer and the insulator.

In fifth examples, for any of the first through fourth examples, the epitaxial structure is laterally adjacent to a sidewall of the insulator layer.

In sixth examples, for any of the first through fifth examples, the first portion of the epitaxial structure has a first dopant concentration, and the second portion of the epitaxial structure has a second dopant concentration, wherein the first dopant concentration is less than the second dopant concentration.

In seventh examples, for any of the first through sixth examples, the metallization structure is on a sidewall of the insulator layer below the epitaxial structure.

In eighth examples, for any of the first through seventh examples, the metallization structure includes an adhesion layer in contact with the epitaxial structure, and a fill layer adjacent to the adhesion layer.

In ninth examples, for any of the first through eighth examples, the metallization structure includes at least one of titanium, tungsten, cobalt, ruthenium, titanium or a group III material.

In tenth examples, for any of the first through ninth examples, wherein there is void between metallization structure and the sidewall of the insulator layer below the epitaxial structure.

In eleventh examples, for any of the first through tenth examples, the second semiconductor body has a width along a first direction, the spacer has a width along the first direction and the gate has a width along the first direction, wherein the width of the semiconductor body is less than a combined width of the gate and the spacer.

In twelfth examples, for any of the first through eleventh examples, the first device includes three terminals, and wherein the first terminal and the second terminal each include a semiconductor having a same conductivity type, and wherein the device further includes a gate on the semiconductor body, between the first terminal and the second terminal.

In thirteenth examples, for any of the first example, the epitaxial structure includes a first portion and a second portion, the first portion between the insulator layer and the spacer, and the second portion extending beyond the dielectric spacer and the insulator.

In a fourteenth example, a method of forming a stacked device includes receiving a wafer having a stack including a semiconductor material over a first device structure, where the first device structure has a plurality of terminals. The method further includes patterning the semiconductor material to form a semiconductor body and patterning a gate on the semiconductor body. The method further includes forming a spacer adjacent to the semiconductor body and forming an opening and removing a portion of the semiconductor body adjacent to the spacer, the opening further exposing one of the terminals of the first device structure. The method further includes laterally recessing a sidewall of the semiconductor body, forming an epitaxial structure on the sidewall and forming a metallization structure in the opening, where the metallization structure is adjacent to the epitaxial structure, and in contact with one of the plurality of terminals of the first device structure.

In a fifteenth example, for any of the fourteenth example, prior to forming the epitaxial structure, the method further includes laterally recessing a portion of the sidewall of the semiconductor body under a portion of the gate.

In sixteenth examples, for any of the fourteenth through fifteenth examples forming the epitaxial structure includes forming a first portion of the epitaxial structure adjacent to the sidewall of the semiconductor body under the gate, forming a second portion under the spacer.

In seventeenth examples, for any of the fourteenth through sixteenth examples, forming the epitaxial structure further includes laterally extending a third portion of the epitaxial structure beyond a sidewall of the spacer.

In eighteenth examples, for any of the fourteenth example forming a first metallization structure and a second metallization structure includes forming a first opening and a second opening. The method further includes laterally recessing a first sidewall of the semiconductor below a sidewall of the first portion of the spacer and laterally recessing a second sidewall of the semiconductor body below a sidewall of the second portion of the spacer. The method concludes by forming a first epitaxial structure adjacent to the first sidewall and forming a second epitaxial structure adjacent to the second sidewall.

In nineteenth examples, for any of the fourteenth example the method further includes forming a second opening to remove a second portion of the semiconductor body adjacent to a second portion of the spacer, where the second portion of the semiconductor body is opposite to a first portion of the semiconductor body. The method further includes laterally recessing a second sidewall of the semiconductor body below a sidewall of the second portion of the spacer. The method further includes forming a second epitaxial structure adjacent to the second sidewall and forming a second metallization structure in the second opening, where the second metallization structure is adjacent to the second epitaxial structure, and on a second of the plurality of terminals of the first device structure.

In a twentieth example, an apparatus includes a device structure having a first device structure above a second device structure. The first device structure includes a first body that includes a semiconductor material, and a plurality of terminals coupled with the first body. The device structure further includes an insulator between the first device structure and the second device structure, where the second device structure includes a second body including a semiconductor material. The second device structure further includes a gate coupled to the second body, a spacer including a dielectric material adjacent to the gate, an epitaxial structure adjacent to a sidewall of the second body and between the spacer and the insulator, where the epitaxial structure includes a semiconductor material different from the semiconductor material of the second body and an impurity dopant. A metallization structure is coupled to sidewall surfaces of the epitaxial structure, and further coupled with one of the terminals of the first device. The apparatus further includes a memory device coupled with the metallization structure of the second device structure.

In twenty first examples, for any of the twentieth example, the second semiconductor body includes a first group IV material and the epitaxial structure includes a compound including at least two group IV materials and a dopant.

In twenty second examples, for any of the twentieth through twenty first examples, the epitaxial structure includes a first portion and a second portion, the first portion between the insulator layer and the gate and a second portion between the insulator layer and the spacer and a third portion extending beyond the spacer and the insulator.

In twenty third examples, for any of the twentieth through twenty second examples, the metallization structure is on a sidewall of the insulator layer below the epitaxial structure. In twenty fourth examples, for any of the twentieth example, the memory element includes a resistive random-access memory (RRAM) element coupled with the drain contact, where the RRAM element includes a bottom electrode, a switching layer above the bottom electrode, where the switching layer has a chemical composition, $MO_{2-X}$, where M is a metal and O is an oxide, and where X is approximately in the range from 0 to 0.05. The memory element further includes a top electrode above the switching layer. In twenty fifth examples, for any of the twentieth example, the memory element includes a magnetic tunnel junction (MTJ) device coupled with the drain contact, where the MTJ device includes a fixed magnet, a tunnel barrier above the fixed magnet, wherein the tunnel barrier includes magnesium and oxygen and a free magnet above the tunnel barrier.

What is claimed is:

1. An integrated circuit (IC), comprising:
   a first device structure comprising:
      a first body of semiconductor material comprising at least one of silicon or germanium; and
      a plurality of terminals coupled with the first body; and
   an insulator layer between the first device structure and an underlying second device structure, wherein the insulator layer comprises silicon and oxygen, and wherein the second device structure comprises:
      a second body of semiconductor material comprising at least one of silicon or germanium;
      a gate electrode coupled to the second body;
      a spacer adjacent to a sidewall of the gate electrode;
      a source or drain material coupled with the second body and between at least a portion of the spacer and the insulator layer, wherein the source or drain material comprises at least one of silicon or germanium and one or more donor or acceptor impurities, and;
      a metallization structure in contact with the source or drain material, wherein the metallization structure extends through a thickness of the insulator layer and is coupled with one of the terminals of the first device structure.

2. The IC of claim 1, wherein the metallization structure is in contact with a source or drain terminal of the first device structure.

3. The IC of claim 1, wherein the insulator layer comprises silicon, oxygen, nitrogen, or carbon.

4. The IC of claim 1, wherein at least a region of the insulator layer between the first device structure and the second device structure is substantially planar.

5. The IC of claim 4, wherein a portion of the source and drain material is between the gate electrode and the insulator layer.

6. The IC of claim 1, wherein the second body of semiconductor material is over the first body of semiconductor material and the terminals of the first device structure comprise a first gate electrode that is under the gate electrode of the second device structure.

7. The IC of claim 1, wherein a portion of the source or drain material is laterally adjacent to a first portion of a sidewall of the insulator layer.

8. The IC of claim 7, wherein the metallization structure is in contact with a second portion of the sidewall of the insulator layer, below the first portion of the sidewall.

9. The IC of claim 1, wherein the metallization structure comprises an adhesion layer in contact with the source or drain material, and a fill layer adjacent to the adhesion layer.

10. The IC of claim 1, wherein the metallization structure comprises at least one of titanium, tungsten, cobalt, ruthenium, titanium or a group III material.

11. The IC of claim 1, further comprising a memory device coupled with the metallization structure, the memory device comprising a resistive memory device or a magnetic tunnel junction (MTJ) memory device.

12. A stacked transistor structure, comprising:
   a first transistor under a second transistor with an intervening insulator layer therebetween, wherein the second transistor comprises:
      a gate electrode over a channel material comprising at least one of silicon or germanium; and
      a source or drain material coupled to the channel material and below a spacer that is adjacent to a sidewall of the gate electrode; and
   a metallization structure in contact with the source or drain material, wherein the metallization structure extends through a thickness of the insulator layer and is coupled with a terminal of the first transistor.

13. The stacked transistor structure of claim 12, wherein the source or drain material comprises two group IV elements.

14. The stacked transistor structure of claim 12, wherein the metallization structure is in contact with a sidewall of the insulator layer.

15. A method of forming a stacked transistor structure, the method comprising:
   receiving a workpiece comprising a semiconductor material separated from a lower transistor structure by an intervening insulator layer;
   forming a semiconductor body comprising the semiconductor material;
   forming a gate coupled to the semiconductor body;
   forming a spacer adjacent to the gate;
   forming an opening through the insulator layer and removing a portion of the semiconductor body adjacent to the spacer, the opening further exposing a terminal of the lower transistor structure;
   laterally recessing a sidewall of the semiconductor body;
   forming a source or drain material in contact with the sidewall of the semiconductor body; and
   forming a metallization structure in the opening, the metallization structure in contact with the source or drain material, and in contact with the terminal of the lower transistor structure.

16. The method of claim 15, wherein:
   laterally recessing the sidewall of the semiconductor body undercuts a portion of the gate; and
   forming the source or drain material at least partially fills in an undercut portion of the gate.

17. The method of claim 16, wherein:
   forming the metallization structure further comprises forming metallization in contact with a sidewall of the insulator layer; and
   forming the source or drain material further comprises laterally extending the source or drain material beyond the sidewall of the insulator layer.

18. The method of claim 15, wherein forming the opening through the insulator layer comprises exposing a contact metallization of the lower transistor structure.

19. The method of claim 15, wherein the semiconductor material comprises silicon or germanium.

20. The method of claim 19, wherein the source or drain material comprises two group IV elements.

* * * * *